United States Patent [19]

Suzuki et al.

[11] Patent Number: 5,594,236
[45] Date of Patent: Jan. 14, 1997

[54] SUNLIGHT SENSOR

[75] Inventors: Yasutoshi Suzuki, Okazaki; Kenichi Yokoyama, Nagoya; Koki Mizuno; Inao Toyoda, both of Okazaki; Yukio Tsuzuki, Nukata-gun, all of Japan

[73] Assignee: Nippondenso Co., Ltd., Kariya, Japan

[21] Appl. No.: 356,083

[22] Filed: Dec. 14, 1994

[30] Foreign Application Priority Data

Dec. 14, 1993 [JP] Japan .................................. 5-313020
May 20, 1994 [JP] Japan .................................. 6-106491

[51] Int. Cl.$^6$ .......................... H01J 40/14; H01L 31/0203
[52] U.S. Cl. ........................ 250/214.1; 257/433; 257/434
[58] Field of Search .................................. 362/802, 276; 257/433, 434, 435, 465; 250/214.1

[56] References Cited

U.S. PATENT DOCUMENTS 5,455,415 10/1995 Yamada .................................. 250/214.1

FOREIGN PATENT DOCUMENTS

| 57-39537 | 8/1982 | Japan . |
|---|---|---|
| 58-35934 | 3/1983 | Japan . |
| 61-280676 | 12/1986 | Japan . |
| 63-182874 | 7/1988 | Japan . |
| 2108925 | 4/1990 | Japan . |
| 3266475 | 11/1991 | Japan . |
| 456618 | 2/1992 | Japan . |
| 6232383 | 8/1994 | Japan . |

*Primary Examiner*—Scott J. Sugarman
*Assistant Examiner*—Ricky Mack
*Attorney, Agent, or Firm*—Cushman Darby & Cushman IP Group of Pillsbury Madison & Sutro LLP

[57] ABSTRACT

A sunlight sensor is provided which detects sunlight by means of a semiconductor device and achieves the desired elevation angle characteristics. The sunlight sensor is implemented as a semiconductor device having p+ layers 10 and 11 as a light-responsive section and an n+ or n layer 9 as a light-nonresponsive section, and additionally having a light-detection element 2 which outputs a detection signal responsive to the amount of light received by the p+ layers 10 and 11. A light-transparent molding 4 is provided at least over the light-detection element 2, and additionally a light-cutoff mask 5 is provided on the transparent molding 4. The relative positions of the light-cutoff mask, the p+ layers 10 and 11, and the n+ or n layer 9 are then established. By doing this, of the shadow of the light-cutoff mask 5 which is created when incident sunlight 13 and 14 strikes the light-detection element, the surface area of at least the part of the shadow which falls on the p+ layers 10 and 11 and the part of the shadow that falls on the n+ or n layer 9 are controlled so as to obtain the desired elevation angle characteristics.

16 Claims, 13 Drawing Sheets

ND, 236

SUNLIGHT SENSOR

BACKGROUND OF THE INVENTION

1. Field of the Invention

The present invention is related to a sunlight sensor which detects an amount of sunlight, and more specifically, to a sunlight sensor used in the control of an air conditioner installed in a vehicle, and which distinguishes the condition of the sunlight, including the angle of elevation of the sunlight.

2. Description of the Related Art

In an air conditioner installed in a vehicle, the temperature inside the vehicle is measured, and automatic controls optimize the temperature inside the car. In addition to the interior temperature, information related to the sunlight entering the vehicle is also an important part of the thermal environment inside the vehicle. When there is much sunlight entering through a window, it is necessary for the cooling device to work harder. That is, the output of an air conditioner is controlled based on the direction of incidence of the sunlight. It is desirable, when using a sunlight sensor in this manner, to reduce the air conditioner output when the sunlight is incident from directly above and to make the output peak when the elevation angle of the sun is in the region of 45°.

To optimize air conditioning with a vehicular air conditioner, it is desirable to not only detect the amount of sunlight with the sensor, but also to control the air conditioner output according to the direction of the sunlight. Specifically, it is desirable to reduce the output when the sunlight is incident from directly above and to make the output peak when the elevation angle is in the region of 45°.

In a prior art sunlight sensor, as disclosed in Japanese Unexamined Patent Publication No. 2-99835, a light-receiving element 39, such as a photodiode, which outputs an electrical signal responsive to the amount of sunlight is mounted at the bottom part of covered-dish-shaped eyelet 38 to which lead wire 37 is connected. Light-receiving element 39 has a light-receiving surface 40 on its top surface connected, via a bonding wire 41, to a lead wire 42. Lead wire 42 is held by the borosilicate glass that fills the bottom part of the covered-dish-shaped eyelet 38. On the outer circumference of the covered-dish-shaped eyelet 38 is welded a cylindrically shaped eyelet 45 which is fitted at its opened top end around a lens 44 which covers the light-receiving surface 40 of the light-receiving element 39. By imparting a special shape to this lens 44, the amount of sunlight (not shown in the drawing) which reaches the light-receiving surface 40 via lens 44 increases as the angle of incidence of the sunlight with respect to the perpendicular increases, with the output becoming maximum when the sunlight is at a prescribed inclination.

In a sunlight sensor as described above, by means of the shape of the lens which covers the light-receiving surface of the light-receiving element, the output is maximum when the sunlight is incident at a certain prescribed angle.

However, with this configuration, to obtain the desired elevation angle characteristics, it is necessary to provide a highly precise lens shape, which is extremely costly.

Furthermore, because the output, which is based on the amount of sunlight incident to the total light-receiving surface, is greatly influenced by the relative position relationship of the lens and the light-receiving surface, positioning of the lens becomes difficult. For that reason, extra light other than the desired light strikes the light-receiving surface, thereby preventing the sufficient achievement of the desired elevation angle characteristics.

In recent years, with advances being made in semiconductor technology, there has been a strong demand for the application of this technology to the achievement of the desired elevation angle characteristics in the detection of sunlight.

In the above-described prior art, the output, which corresponds to the amount of sunlight incident on the total light-receiving surface, is greatly influenced by the relative position relationship of the lens and the light-receiving surface, so that the positioning of the lens becomes difficult. Furthermore, stray light, other than the desired incident light, strikes the light-receiving surface, thereby making the sufficient achievement of the desired elevation angle characteristics difficult.

To obviate the above problems, a practical sunlight sensor using semiconductor technology is desirable.

SUMMARY OF THE INVENTION

The present invention addresses the above-described problems, and has as an object the provision of a sunlight sensor which detects sunlight by using a semiconductor device and which has the desired elevation angle characteristics with good sensitivity.

Further, the present invention provides a sunlight sensor having the desired elevation angle characteristics with good sensitivity, which uses a semiconductor light-receiving element without using components requiring highly precise shapes, and which enables the easy establishment of the desired elevation angle characteristics.

Specifically, to achieve the above-described object, a sunlight sensor according to the present invention comprises a light-responsive section which outputs a signal responsive to incident sunlight, a light-nonresponsive section which does not output a signal, regardless of whether or not there is incident sunlight, a light-detection element which has a light-receiving surface which has the light-responsive section and the light-nonresponsive section on one and the same plane, a transparent material which is provided at least at the top of the light-detection element, a cutoff means which is provided at the top of the light-detection element at the prescribed distance from it, and which has a hole part which selectively passes sunlight which is incident to the light-receiving surface of the light-detection element to cause it to strike the light-responsive section and light-nonresponsive section, wherein the light-cutoff means is of the required width and also has a hole part through which at least sunlight passes, and wherein the light-responsive section outputs a signal which is responsive to the total amount of light received or the sunlight incident from the hole part and the sunlight incident from the outside edge surface of the light-cutoff means.

As is clear from the above-described constitution, a sunlight sensor according to the present invention has a carefully devised positional relationship between the light-cutoff means element and the light-receiving surface (light-responsive section and light-nonresponsive section) of the sunlight sensor which is to achieve the desired elevation angle characteristics. As a result, light is appropriately incident to the light-responsive section, this light being both the light incident from the hole part which has a hole at the top or the light-responsive section and the light which is incident from the outside surface of the light-cutoff element.

In this manner, preference is given to receiving light at the light-receiving surface from an inclination to the right and left, thereby achieving a sunlight sensor with the desired elevation angle characteristics and improved sensitivity.

DESCRIPTION OF THE PREFERRED EMBODIMENTS

Embodiments of the sunlight sensor according to the present invention will be described in detail below, with reference being made to the accompanying drawings.

Figure 1:
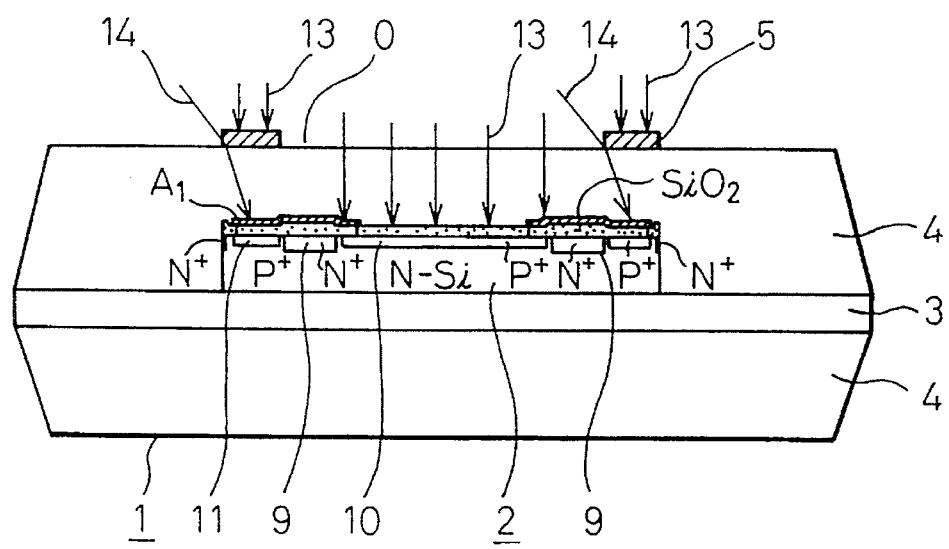
FIG. 1 is a cross-sectional view of a sunlight sensor according to the present invention.

Specifically, FIG. 1 shows one example of the configuration of a first embodiment of a sunlight sensor 1 according to the present invention. Sunlight sensor 1 has a light-responsive section 10 which outputs a signal responsive to incident sunlight, a light-nonresponsive section 9 which does not output a signal, regardless of whether or not there is incident sunlight, a light-detection element 2 which has a light-receiving surface which includes the light-responsive section 10 and the light-non-responsive section 9 on one and the same plane, a transparent material 4 which is provided at least at the top of the light-detection element 2, and a cutoff means 5, which is provided at the top of the light-detection element 2 at the prescribed spacing. Cutoff means 5 selectively passes sunlight which is incident to the light-receiving surface of the light-detection element to cause it to strike the light-responsive section 10 and light-nonresponsive section 9. Furthermore, light-cutoff means 5 is of the required width and also has a hole part 0 through which at least sunlight passes. Light-responsive section 10 outputs a signal which is responsive to the total amount of light received of the sunlight 13 incident from the hole part 0 and the sunlight 14 incident from the outside edge surface of the light-cutoff means 5.

To more completely describe a sunlight sensor according to the present invention as noted above, its configuration will be described below.

FIG. 1 is a cross-sectional view of a sunlight sensor having a transparent molding photodiode according to the present invention. In this sunlight sensor, epoxy 4 (transparent molding), which will serve as the transparent material is melted at a high temperature, and then is poured into a mold (not shown in the drawing), after which a silicon photodiode 2, which is die-mounted to the top of lead frame 3 using silver paste and which will serve as the light-detection element, is placed inside it, thereby forming the transparent mold. In the first embodiment, the size of the silicon photodiode 2 is 2.3 to 3.1 mm square with a thickness of approximately 400 μm, the size of the transparent molding 4 being 5 to 6 mm square, with a thickness of approximately 2 mm. A ring-shaped light-cutoff mask is formed onto the top surface of this transparent molding 4 by means of hot pressing, thus forming the sunlight sensor 1 with a transparent molding photodiode.

Figure 2:
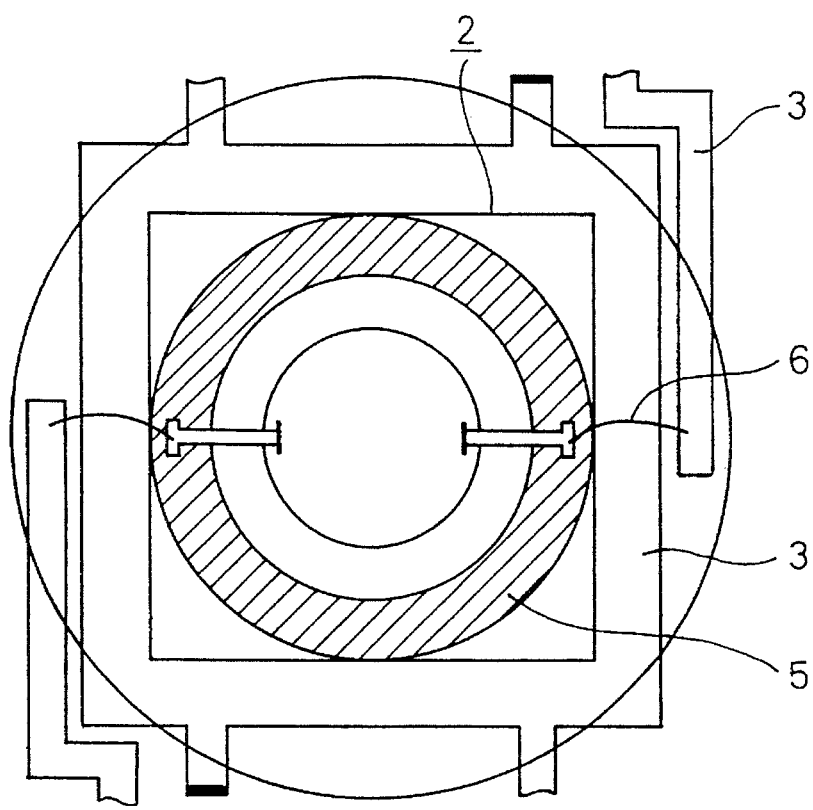
FIG. 2 is a top view of the main parts of a sunlight sensor according to the present invention.

FIG. 2 shows the top view of the main parts of sunlight sensor 1 which is constructed in the above manner.

As shown in FIG. 2, viewed from the top of the sunlight sensor 1 (that is, from direction perpendicular to the drawing), the light-cutoff mask 5, which selectively passes sunlight, is formed with a certain width in the shape of a ring onto the surface of the transparent molding 4 in such as manner that the four sides are aligned with respect to the silicon photodiode 2. Before melting the epoxy 4 and pouring it into a mold (not shown in the drawing), gold wire 6 is bonded to lead frame 3o A signal is transmitted via wire 6 from the silicon photodiode by means of the aluminum electrode formed on the surface of the silicon photodiode.

Figure 3:
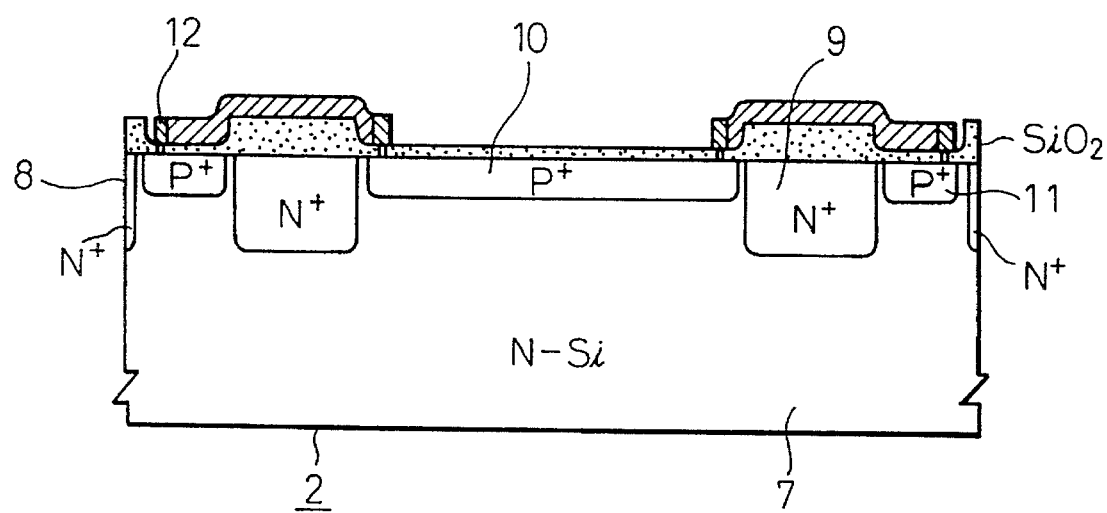
FIG. 3 is a cross-sectional view of a silicon photodiode of a sunlight sensor according to the present invention.

The silicon photodiode 2 which is located within a sunlight sensor such as this has a cross-sectional construction as shown in FIG. 3. Silicon photodiode 2 can be satisfactorily manufactured using conventional materials and semiconductor manufacturing processes, and, therefore, a detailed description of the common parts will not be presented herein. In the first embodiment, a p+ layer (not shown in the drawing) is formed on top of an n-type substrate 7, an n+ channel stopper layer 8 being subsequently provided on the outside of the n type silicon substrate 7. Further, an n+ or n layer 9 is provided on the inside with respect to the n+ channel stopper layer 8 as a light-nonresponsive section, which divides the previously formed p+ layer into an outside p+ layer 11 and an inside p+ layer 10.

Because the light-cutoff mask 5 and silicon photodiode formed on the surface of the transparent molding 4 and the n+ layer or n layer provided on the silicon photodiode 2 as a light-nonresponsive section must be configured so as to mutually interact, the essential characteristics of the first embodiment will be described in turn below, in view of both of these constituent elements.

First, when detecting the amount of sunlight using a sunlight sensor having the above-described configuration, the elevation angle characteristics of the sunlight sensor 1 are influenced by the distance (thickness), h, from the surface of the silicon photodiode 2 of the transparent molding 4 to the upper surface of the sunlight sensor 1, by the inner diameter and the outer diameter of the light-cutoff mask 5, by the outer diameter of the inside p+ layer of the silicon photodiode, by the inner diameter and the outer diameter of the n+ or n layer, and by the inner diameter and outer diameter of the outside p+ layer. The output current of the silicon photodiode 2 when the sun is directly overhead and sunlight is perpendicularly incident to the sunlight sensor 1, and when the sun is at an angle from the top and sunlight is incident at an inclination mainly varies by virtue of angle dependency of the amount of sunlight, the angle dependency of the amount of absorption within the epoxy 4, and the reduction in light-receiving surface area (total amount of light received) because of the shadow of the light-cutoff mask 5. Of these influences, to control the elevation angle dependency of sunlight sensor 1, it is necessary to make the effect of the shadow of the light-cutoff mask 5 large and to optimize the designs of the light-cutoff means, light-responsive section, and light-nonresponsive sections so that the silicon photodiode directionality characteristics change because of reduction of the light-receiving surface area due to the shadow.

Therefore, as a result of a careful investigation made by the inventors of the present invention, it was discovered that the respective elements must be configured so as to sufficiently satisfy the following noted conditions.

First, it is necessary for the width $L_{PO+}$ of the outside p+ layer 11 formed as shown in FIG. 3 to satisfy the following equation 1.

$$L_{PO+} \leq h \cdot \tan\{\sin^{-1}(1/n)\}$$

In the above, h is the thickness of the transparent material on the top surface of the silicon photodiode, and n is the index of refraction of the transparent material.

From equation 1, for the first embodiment which uses epoxy 4 as the transparent material, with a thickness h=600 μm, and an index of refraction n=1.54, the outside p+ layer 11 width $L_{PO+}$ is $L_{PO+} \leq 5121$ μm.

Next, the ring-shaped light-cutoff mask 5 which is formed on the surface of the transparent molding 4 is provided so as to have a width $L_S$ directly above the outside p+ layer 11 (from the top of the drawing FIG. 1). The width $L_{N+}$ of the n+ or n layer is established by the width $L_S$ of the transparent mask 5 and the thickness h of the transparent material, and it is desirable that these values satisfy the condition of equation 2.

$$L_{N+}=L_S=L_{PO+}$$

From equation 2, if we consider the result that $L_{PO+} \leq 5121$ μm, the value of $L_{N+}$ and $L_S$ are set to be approximately equal.

Figure 4:
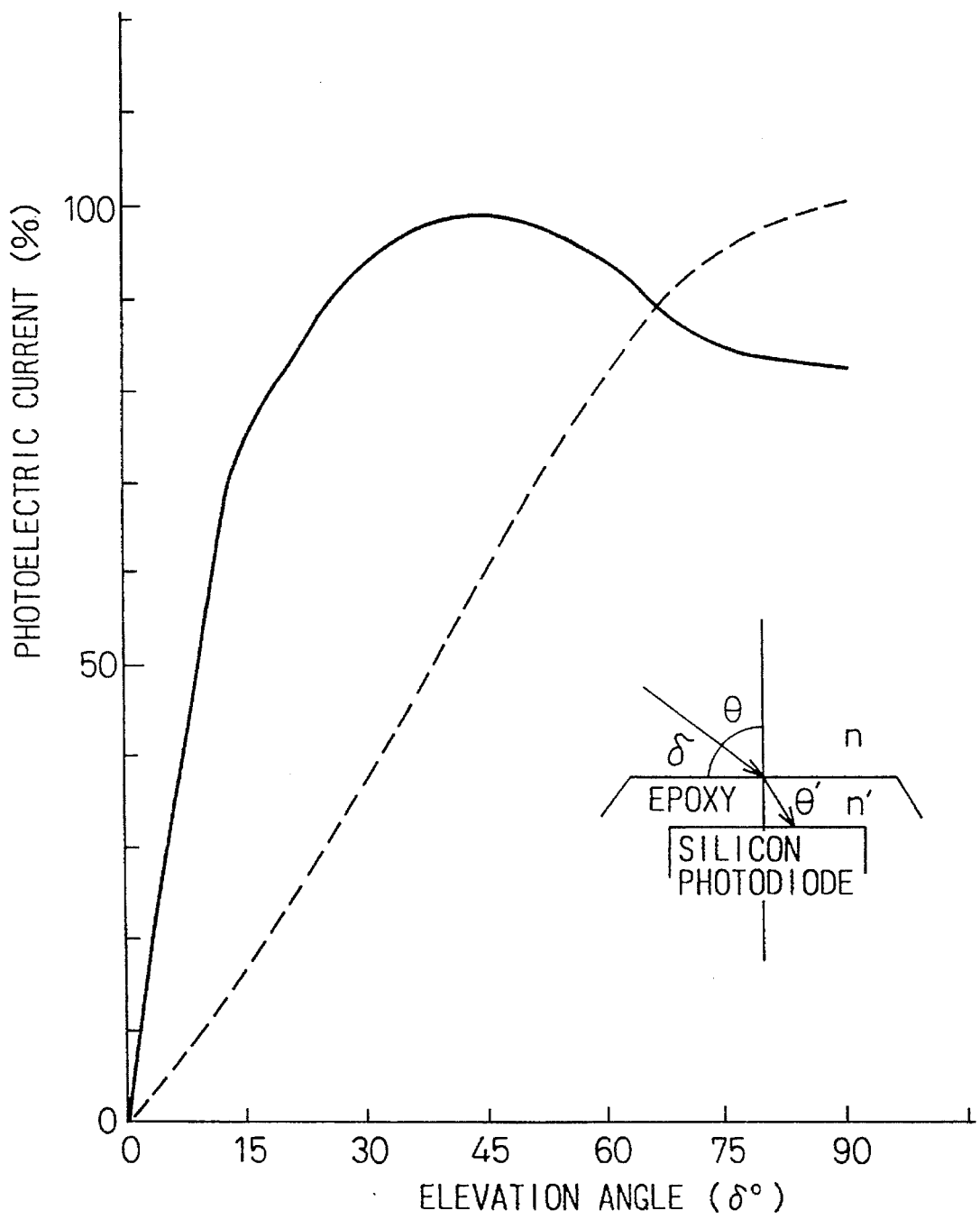
FIG. 4 shows the elevation angle characteristics of a silicon photodiode of a first embodiment of the present invention.

Next, the directionality characteristics of a sunlight sensor having a transparent molding photodiode with a configuration optimized as described above will be explained in conjunction with FIG. 4. In FIG. 4, the horizontal axis represents the elevation angle δ° of the sunlight, and the vertical axis represents the elevation angle characteristics in terms of % of photoelectric current. For the purpose of comparison, the elevation angle characteristics of a sunlight sensor (not shown in the drawing) which does not have a light-nonresponsive section, such as the n+ or n layer, are represented by the broken line. According to these characteristics, as the elevation angle of the sunlight changes to come from directly above, that is, as it changes from δ°=0° to δ°=90°, the photoelectric current changes proportionally, reaching a maximum when the elevation angle δ° is 90°. This is because as the angle of the incident light changes from an elevation angle δ° of 90° to some inclination (δ°=75°→0°), the amount of light exhibits a cos θ dependence, and also because the amount of light absorption within the transparent material also exhibits a dependence on the angle θ, the absorption exhibiting a decrease. In contrast to this, the elevation angle characteristics of a sunlight sensor according to the first embodiment of the present invention are as shown by the solid line. According to these characteristics, as the incident light changes in inclination from directly sideways to directly overhead, in the range in which the elevation angle changes from 0° to 45°, the photoelectric current increases in proportion to the elevation angle, the value reaching approximately 98% of the maximum value at a δ° of approximately 45°. Then, as the angle is increased up to 90° (that is sunlight directly above), the photoelectric current is decreased proportionally, until it is reduced to a value of approximately 81%.

The reason that the elevation angle characteristics of the sunlight sensor of the first embodiment are as shown by the solid line is as follows. Specifically in the case in which incident light 13 from directly above and incident light 14 at an angle from the top left (although this could, of course, just as well be at an angle from the top right) are both incident to the sunlight sensor 1, in the case of incident light 13 from directly above, the incident light 13 is selectively cut off by the light-cutoff mask 5, so that it strikes only the inside p+ layer 10 at the center which contributes to the generation of the photoelectric current, thereby generating a photoelectric current responsive to this light. When this is the case, the shadow (not shown in the drawing) of the light-cutoff mask 5 with respect to the incident light falls at least on the outside p+ layer 11. In contrast to that, in the case in which the incident light 14 is incident at an angle from the top left (or, of course, from the top right), because incident light 14 strikes the outside p+ layer 11 from the edge of the light-cutoff mask 5, the photoelectric current increases. When this is the case, at least the major part of the shadow (not shown in the drawing) of the light-cutoff mask 5 with respect to incident light 14 falls on the n+ layer or n layer 9.

In this manner, by employing the characteristics which include the mutual relationship between the light-cutoff means and the light-nonresponsive section, it is possible to achieve the desired elevation angle characteristics. In contrast to this, in the sunlight sensor shown by the broken line in FIG. 4, because the shadow of the light-cutoff means inevitably falls on the p+ layer which is the light-responsive section, the photoelectric current inevitably exhibits a maximum when the incident light is incident from directly above (that is, when the elevation angle δ° is 90°), making it impossible to attain the desired elevation angle characteristics. Thus, it is essential to provide either an n+ or an n layer as a light-nonresponsive section between the inside p+ layer 10 and the outside p+ layer 11, and if any shadow occurring of the light-cutoff mask 5 is caused to fall onto either the n+ or n layer 9, this does not contribute to the photoelectric current, regardless of whether or not there is light at this part. By doing this, the elevation angle characteristics shown by the solid line in FIG. 4 are attained.

In a sunlight sensor 1 according to the first embodiment, having elevation angle characteristics as described above, the direction of sunlight for which the output current is maximum can be controlled by means of the optimum design of the width of the n+ or n layer 9, the width of the light-cutoff mask 5, and their relative positions. It is further possible to control the output current occurring for the case of incident light 13 from directly above by means of the light-cutoff mask. Therefore, the costly lens that was required with prior art sunlight sensors in order to achieve the desired elevation angle characteristics is eliminated, and it is possible to establish the angle of incident sunlight that results in the maximum intensity (sunlight thermal load) to be something other than incident light 13 from directly above, thereby improving the incidence dependency. Also, because this is possible using a simple configuration, it is possible to provide a sunlight sensor having the desired incidence angle dependency without sacrificing compactness.

Figure 5:
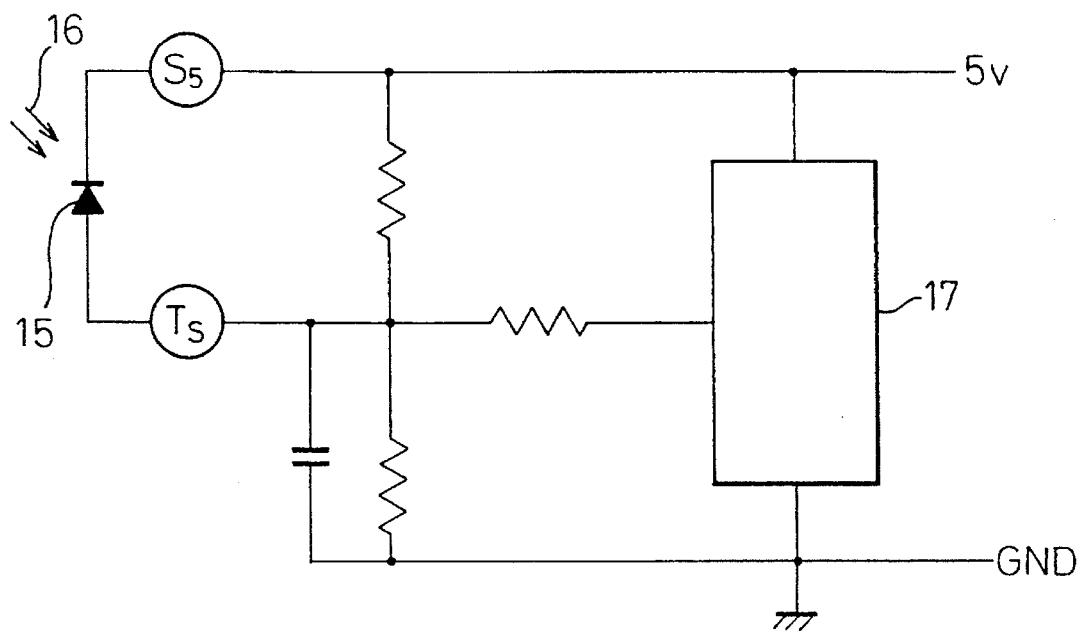
FIG. 5 is a signal processing circuit of a sunlight sensor according to a first embodiment of the present invention.

Next, a signal processing circuit using sunlight according to the first embodiment obtain by optimizing the design, is explained with reference to FIG. 5.

When sunlight 16 is incident to the light detection section of the sunlight sensor (not shown in the drawing), the light-detection element 15 installed within the sunlight sensor detects the sunlight 16 and the light signal is converted to an electrical signal. This converted electrical signal is input to a subsequent signal processing circuit, is controlled by means of an 8-bit microprocessor, and then converted to an air output temperature and amount of air flow from a vehicular air conditioner (not shown in the drawing). This enables the achievement of optimum air conditioning.

Figure 6:
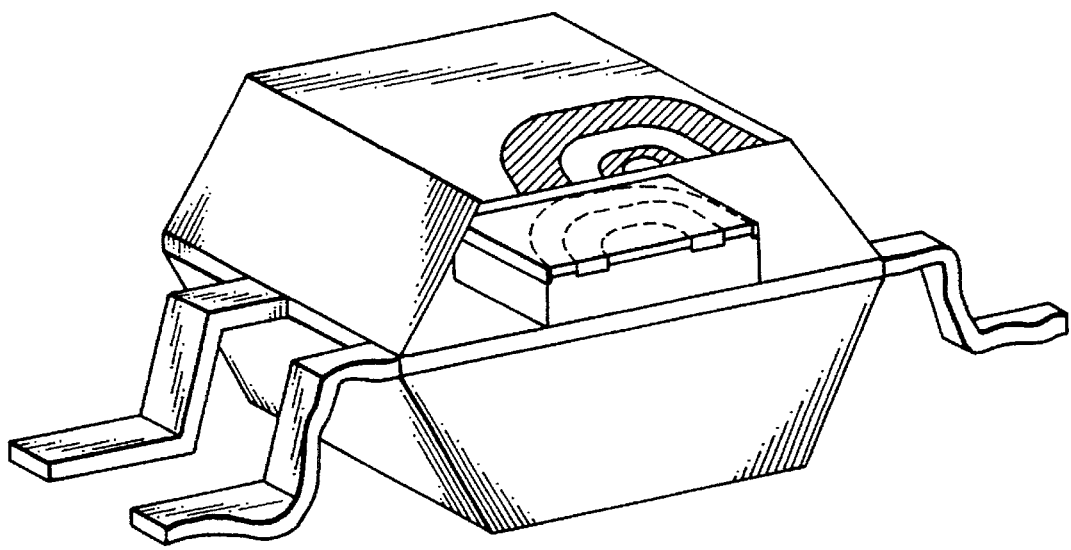
FIG. 6 is a perspective view of a sunlight sensor of a different form of the first embodiment of the present invention.

FIG. 6 shows a perspective view of another form of the first embodiment of the present invention, which is a sunlight sensor in which the ring-shaped light-cutoff mask provided on the surface of the transparent molding is made into a double mask.

As shown in FIG. 6, the double light-cutoff mask further reduces the elevation angle of the incident light at which the maximum output current occurs, and also further increases the drop in output current when light is incident directly from above. The method of analyzing and evaluating this is the same as in the case of the main first embodiment, and will not be presented herein, with the exception of the difference, which is that the elevational angle characteristics are further improved.

Specifically, the first embodiment of the present invention is implemented as a semiconductor device and has the technical means that comprise a light-receiving surface and a light-nonresponsive section both on a light-receiving surface, a light-detection element which outputs a detection signal responsive to the light received at the light-receiving surface, and a light-cutoff means provided on the light-receiving surface. Sunlight incident to the light-receiving surface is selectively passed, and the relative positions of the light-cutoff means, the light-receiving surface, and the light-nonresponsive section are established in such a manner that, of the shadow of the light-cutoff means that can occur when sunlight strikes the light-detection element, at least the surface area of the shadow which falls onto the light-receiving surface and the surface area of the shadow which falls on the light-nonresponsive section are controlled to attain the desired elevation angle characteristics. By means of this configuration, when incident sunlight occurs, the light-cutoff means provided on the transparent material selectively passes the light, which then strikes the light-receiving surface of the light-detection element. The relative positions of the light-cutoff means, the light-receiving surface, and the light-nonresponsive section, are such that at least the surface areas of the shadows cast by the light-cutoff means which fall on the light-receiving surface and light-nonresponsive section are controlled to obtain the desired elevation angle characteristics.

Furthermore, a sunlight sensor according to the present invention can also have an outside light-responsive section 11 on the outside with respect to the light-receiving surface of the light-detection element 2, an inside light-responsive section 10 on the inside with respect to the outside light-receiving surface 11, and additionally can have a light-nonresponsive section 9 provided in between the outside light-responsive section 11 and the inside light-responsive section 10, with a light-cutoff means 5 provided directly at least above the outside light-responsive section.

The light-cutoff means 5 of a sunlight sensor according to the present invention can have at least one ring shape.

Additionally, the light-cutoff means 5 of a sunlight sensor according to the present invention can also be a light-cutoff mask which is formed on the transparent material 4.

Next, the second embodiment of the present invention will be described.

In a sunlight sensor according to the first embodiment as described above, a sufficient effect is achieved in detecting the sunlight strength and elevation using a single light-detection element. However, there is a need to further investigate its right/left angular characteristics. The reason for this is that in a sunlight sensor used in a vehicle, it is desirable to have independent left and right thermal loads and air conditioners in a vehicle (for example, a system capable of providing separate air conditioning of the driver's seat and the front passenger's seat). For that reason, it is necessary to have a sunlight sensor in which the elevation angle characteristics are reduced at δ° =90° (sunlight directly above), and in which there is a peak at δ° =60° (from an inclination from the top), and which is capable of detecting whether sunlight is received from the left or from the right (that is, from the driver's side or from the front seat passenger's side in a left-hand steering wheel vehicle).

In achieving this, the results of a variety of investigations by the inventors of the present invention of the first embodiment indicated that, to achieve good right/left angle control, it is essential to impart a difference to the light-receiving surface area or the silicon photodiode between the right and left sides, and to cause a difference to exist between the relative output current between right and left angles of sunlight, and a means was discovered in addition to the first embodiment described above which simultaneously controlled both the elevation angle characteristics and the right/left angular characteristics. Therefore, it is not only possible with one light-detection element to detect the intensity and elevation of sunlight, but also to simultaneously detect, with the same light-detection element, sunlight from the right and left (hereinafter referred to as right/left angular characteristics), this being described below as the second embodiment of the present invention, with reference made to the drawings.

Because a sunlight sensor according to this second embodiment can be basically manufactured using the same materials and manufacturing methods as the first embodiment, parts which are in common with the first embodiment will be assigned the same reference symbols and will not be described herein.

Accordingly, in the second embodiment of the present invention, the particular characteristic elements, that is, the formation of a new p+ layer on the silicon photodiode that serves as the light-detection element, the new configuration of the light-cutoff mask, and the mutual relationship between these elements will be described.

Figure 7:
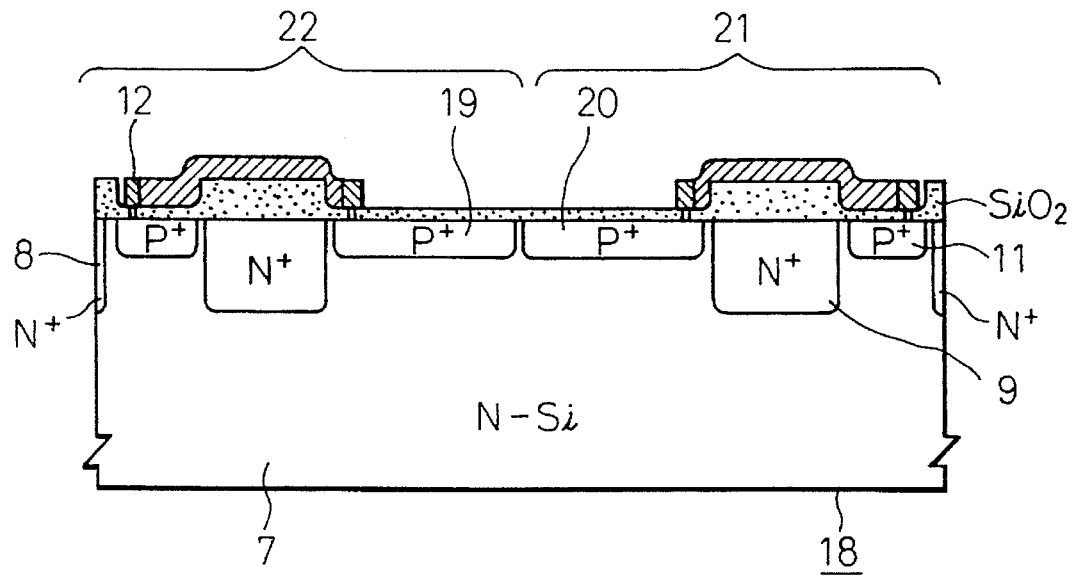
FIG. 7 is a cross-sectional view of a silicon photodiode of a second embodiment of the present invention.

FIG. 7 is a cross-sectional view of the silicon photodiode 18 of the second embodiment of the present invention, in which the light-detection element, in which the inside p+ layer 10 shown in FIG. 3 has been further divided into a left p+ layer 19 and a right p+ layer 20, these areas having approximately equal surface areas (left and right directions in the drawing), so that the silicon photodiode is divided in a right half 21 (hereinafter referred to as the right photodiode) and a left half 22 (hereinafter referred to as the left photodiode).

Figure 8:
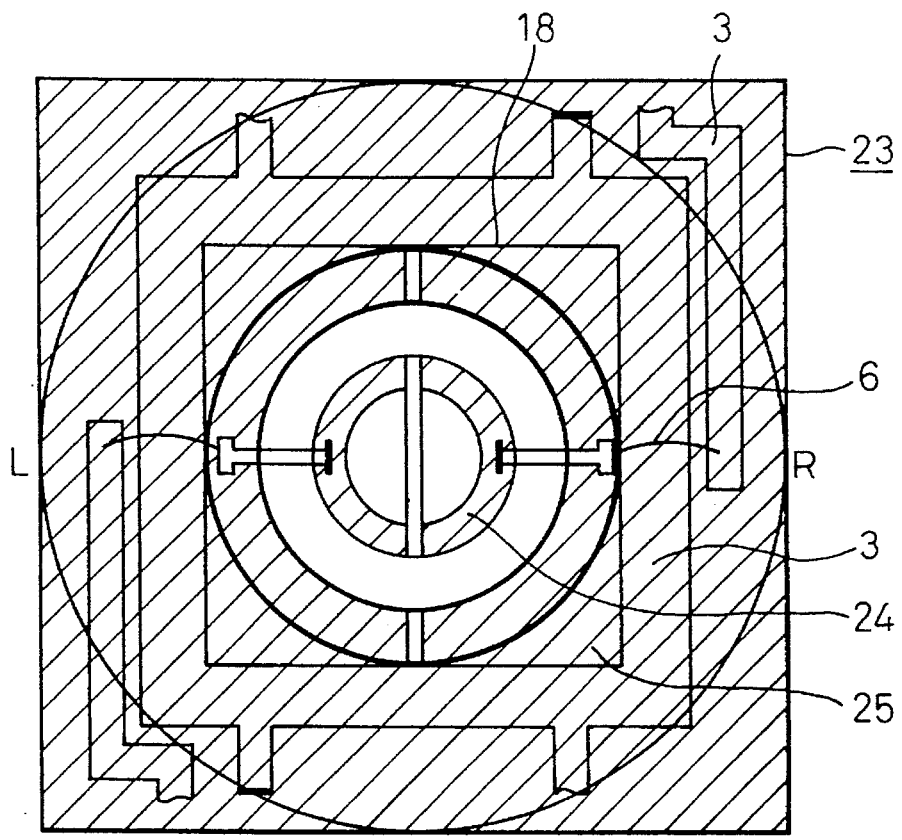
FIG. 8 is a top view of the main parts of a sunlight sensor according to a second embodiment of the present invention.
Figure 9:
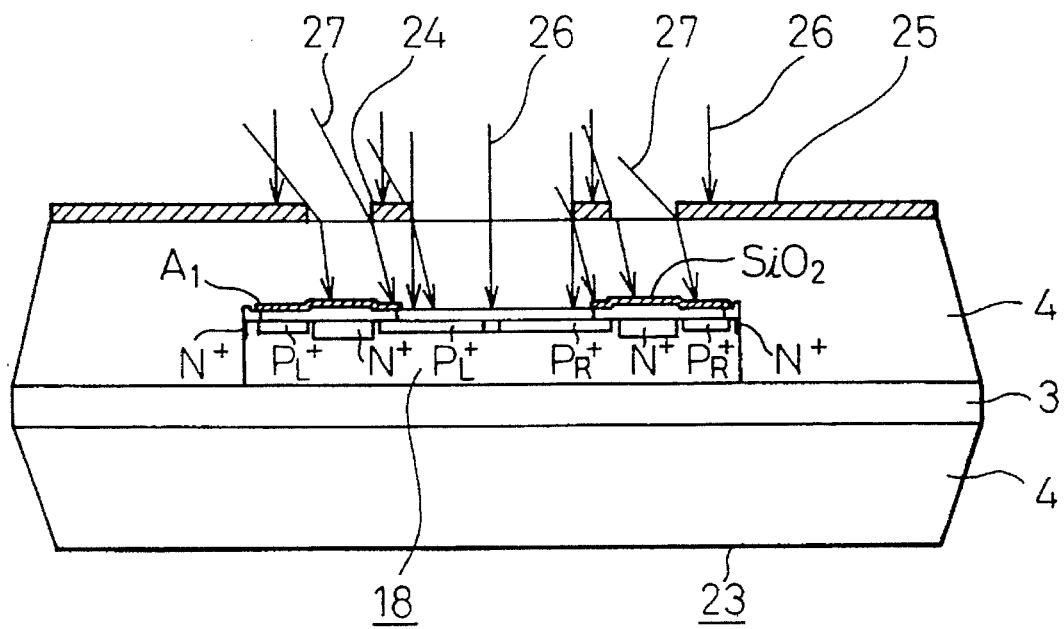
FIG. 9 is a cross-sectional view of a sunlight sensor according to a second embodiment of the present invention.

FIG. 8 shows a top view of the main parts of a sunlight sensor having a transparent molded photodiode which has silicon photodiode 18 having such a construction inside of it. FIG. 9 shows the associated cross-sectional view. The ring-shaped inside light-cutoff mask 24 and arbitrarily shaped outside light-cutoff mask 25 are positioned on the top surface of epoxy 4 in approximately the positions shown in the drawings.

As is the case with the first embodiment, it goes without saying that in this second embodiment the light-cutoff masks 24 and 25 formed on the surface of the transparent molding 4 as light-cutoff means and the light-nonresponsive section n+ or n layer 9 provided on silicon photodiode 18 to serve as a light-nonresponsive section must be configured so as to interact with one another.

Therefore, a description will be presented below as to just how these elements interact.

In FIG. 9, in the case in which incident light 26 is incident from the direction of the top of the drawing, because the light is selectively passed by light-cutoff mask 24 and light-cutoff mask 25, at the photodiode which serves as the light-detection element that contributes to the output current, the incident light 26 strikes only the central p+ layers 19 and 20. If, however, sunlight is incident from the top left (or, of course, from the top right) at an inclination, incident light 27 enters from between the outside light-cutoff mask 25 and the inside light-cutoff mask 24, and strikes the outside p+ layer 11, so that the output current for this portion increases. When this happens, at least the major part of the shadow of the light-cutoff masks 24 and 25 with respect to the incident light 27 fall on n+ or n layer 9. If the entire p+ layer is uniform as a light-responsive section, the shadow will inevitably be formed on the p+ layer, resulting in a reduction in output current for that part, thereby causing an inevitable occurrence of the maximum output current for incident light from directly above. For this reason, an n+ or n layer 9, which is a light-nonresponsive section, is provided between the inside p+ layers (left p+ layer 19 and right p+ layer 20) and the outside p+ layer 11. Even if the shadow of the light-cutoff masks 24 and 25 occurs, it is made to fall on the n+ or n layer 9, so that there is no contribution to the photoelectric current, regardless of whether there is or is not any light striking. By doing this, the elevation angle characteristics shown by the solid line in FIG. 10, in which there is a peak at $\delta°=60°$, are achieved.

The right/left angular characteristics are obtained by means of the difference in output currents between the right photodiode 21 and the left photodiode 22. Thus, in the detection of sunlight from the left and right, it is necessary, by means of the light-cutoff masks 24 and 25, to selectively cut off the incident light 27, so that when the light-receiving surface area of silicon photodiode 18 is reduced, it is reduced non-uniformly between the left and right sides. To do that, with respect to incident light 27 which arrives from the top left at an angle as shown in FIG. 9, the light-receiving surface area of the left photodiode 22 is reduced. The light-receiving surface area of the right photodiode 21 is also reduced, however, not to same degree. In addition, because of the shadow of the outside light-cutoff mask 25 the output current at the p+ layer 12 outside of the left photodiode 22 is zero, the only output being that of the p+ layer 11 of the right photodiode, so as to increase the difference between the left and right outputs. Further, in this second embodiment, in which a division into two is done to yield two regions that are approximately the same, the effect that occurs when light from the top right arrives at an angle is reversed with respect to this, left-to-right.

Figure 11:
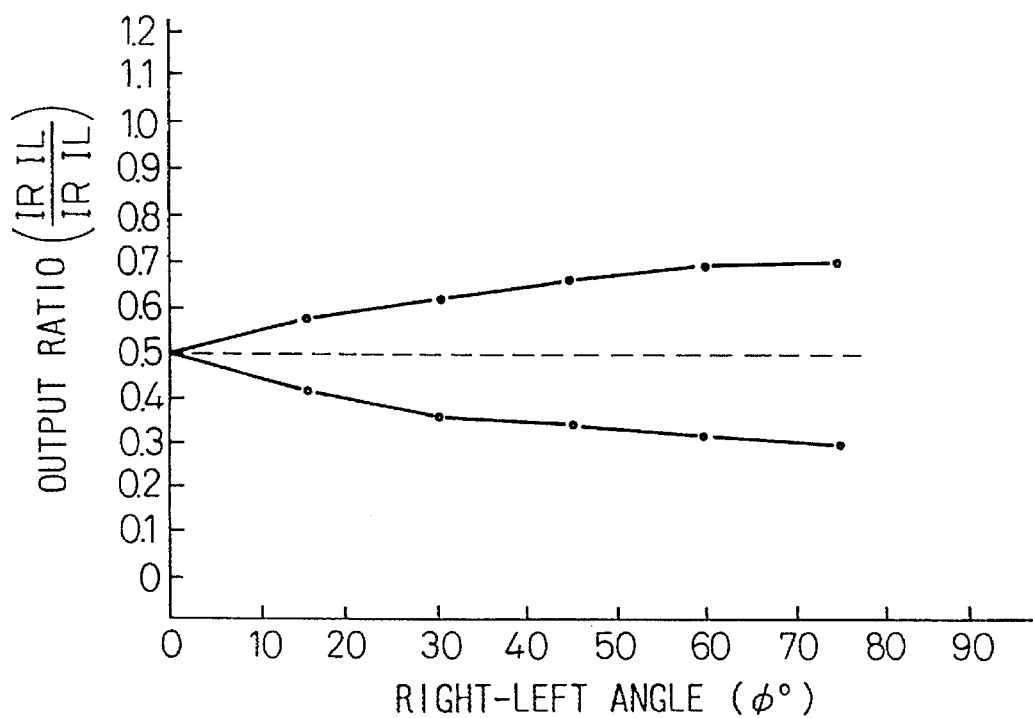
FIG. 11 shows the right/left angular characteristics of a sunlight sensor according to a second embodiment of the present invention.

FIG. 11 shows the right/left angular characteristics of a sunlight sensor 23 having such configuration as described above. It can be seen that as the sunlight changes gradually from directly from the side to an angle $\Phi$ of from 0 to 70° either from the right or from the left, the mutual difference between the output ratios IL/(IR+IL) and IR/(IR+IL) of the light-detection elements 22 and 21, which are divided right-to-left, becomes larger, where IL is the photoelectric current of the left light-detection element and IR is the photoelectric current of the right light-detection element. Therefore, under conditions which enable the attainment of output characteristics such as this, if the configuration is made such that the light-cutoff masks 24 and 25 formed on the transparent molding 4 surface and the n+ or n layer 9 formed on the silicon photodiode interact appropriately, it is possible to freely design the control of elevation angle characteristics and right/left angular characteristics using a single light-detection element by means of the shapes of the light-cutoff masks 24 and 25, the shapes of the p+ layers 19, 20, and 21, the shape of the n+ or n layer 9, and the thickness of the resin molding 4 on the top of the photodiode 18.

Figure 10:
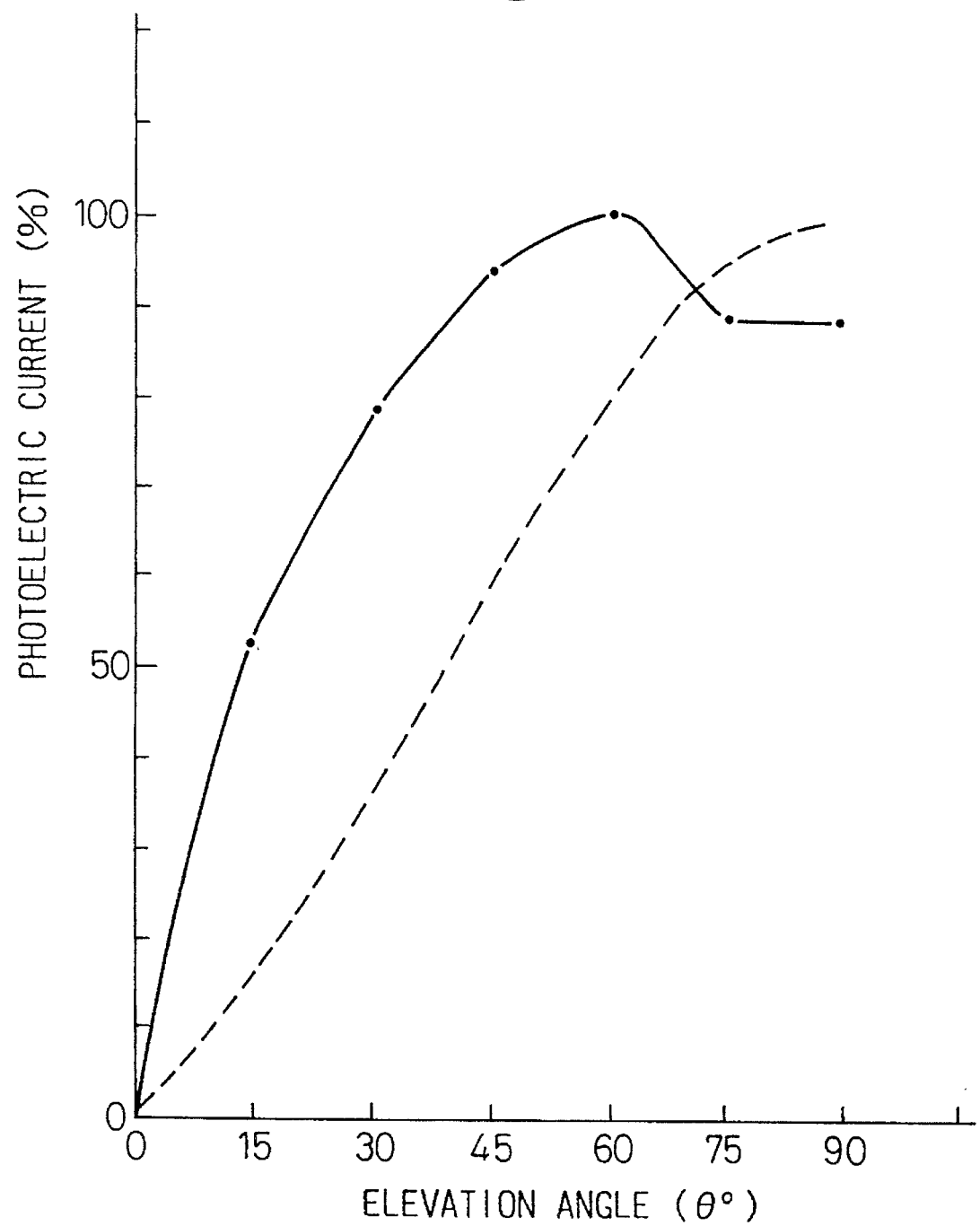
FIG. 10 shows the elevation angle characteristics of a sunlight sensor according to a second embodiment of the present invention.

Furthermore, as a comparison, the elevation angle characteristics for a sunlight sensor (not shown in the drawing) for the case in which the entire p+ provided on the top of the silicon photodiode 18 is uniform are shown in FIG. 10 by a broken line, with the associated right/left angular characteristics shown by the broken line in FIG. 11. From these characteristics, it can be seen that it is natural that not only is the photoelectric current maximum when the incident sunlight is from directly overhead (elevation angle $\delta°=90°$) but also that the right/left angular characteristics are not at all changed. These elevation angle characteristics occur because of the fact that, in comparison with the case of directly overhead incidence (elevation angle $\delta°=90°$), when the incident light is at an inclination there is a $\cos\theta$ dependency in the amount of light, this decreasing as the angle $\delta°$ goes from 75° to 0°, and also because of the fact that there is a dependency on the incidence angle $\theta'$ of the amount of absorption within epoxy 4, this absorption decreasing as the angle changes in that direction. The right/left angular characteristics do not exhibit a right-to-left difference because the light incident to the left and right silicon photodiodes is the same. Therefore, it is clear that a sunlight sensor 23 according to the second embodiment of the present invention has superior elevation angle characteristics and right/left angular characteristics.

Figure 12:
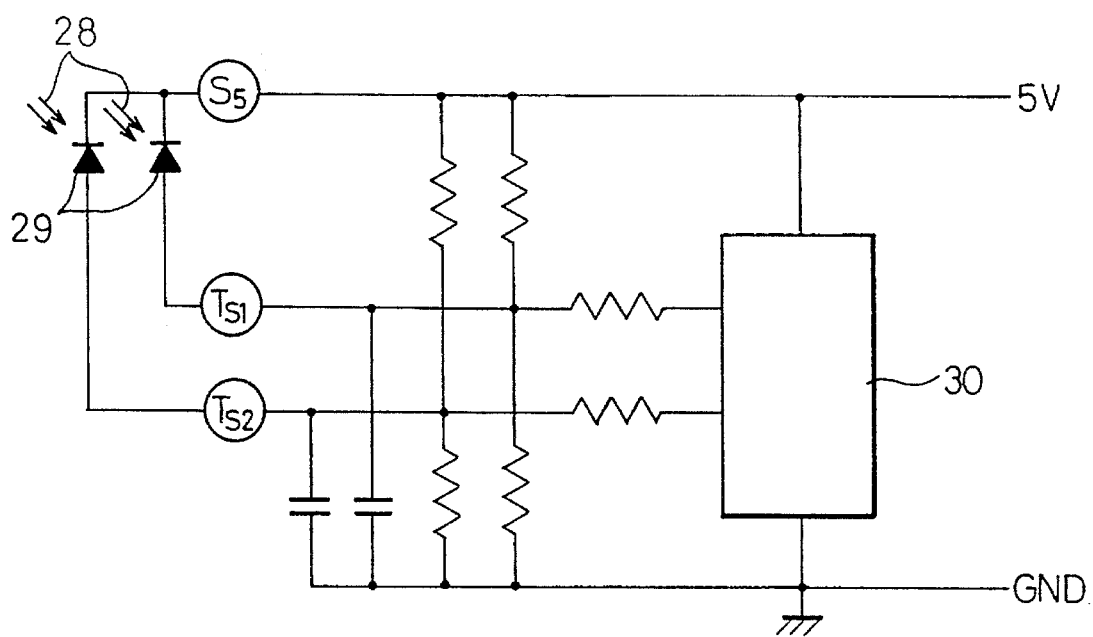
FIG. 12 is a signal processing circuit which uses a sunlight sensor according to the second embodiment of the present invention.

FIG. 12 shows the signal processing circuit used in a sunlight sensor according to the second embodiment of the present invention.

When sunlight 28 is incident to the light detection section of the sunlight sensor (not shown in the drawing), the silicon photodiode 28 detects this sunlight. An 8-bit microprocessor within the subsequent signal processing circuit performs control of the optical signal based on the sunlight output, after which this is converted to an air output temperature and amount of air flow from a vehicular air conditioner (not shown in the drawing), with consideration given to right-to-left balance. This enables the achievement of optimum air conditioning.

In a sunlight sensor 23 having a configuration as described above, left/right angular characteristics are improved because, in addition to the configuration of a sunlight sensor 1 according to the first embodiment, the p+ layer is split right to left (into p+ layers 19 and 20) and a difference is imparted to the left and right light-receiving surface areas so that each of the output current ratios varies in accordance with the sunlight left and right angle and the angle of incidence of maximum sunlight intensity (sunlight thermal load) is an angle other than that at which sunlight is incident from directly above.

Figure 13:
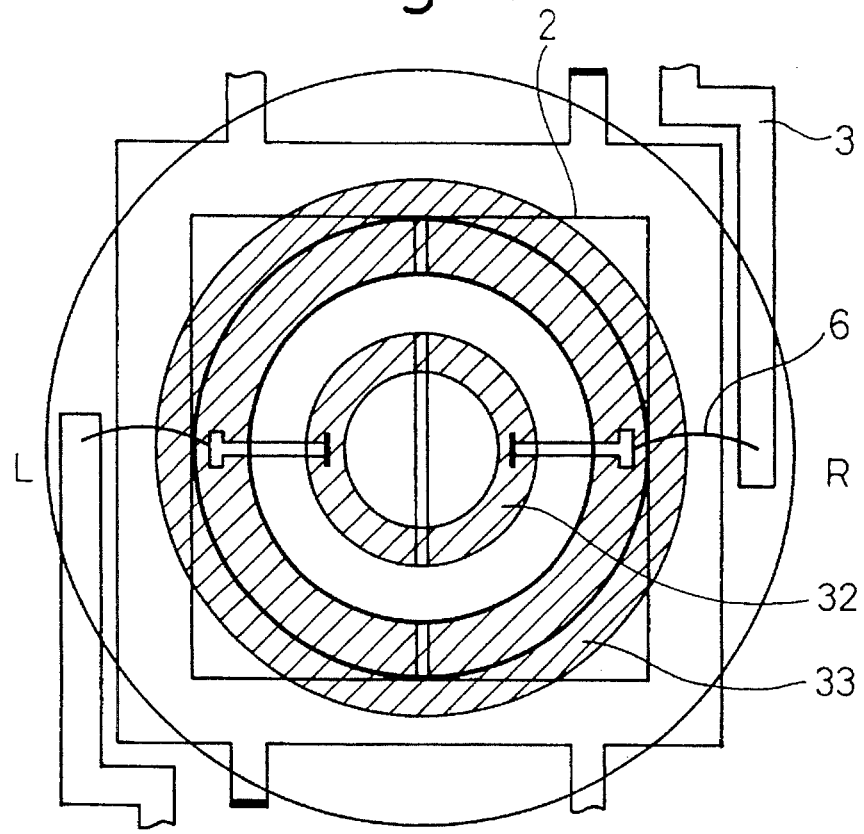
FIG. 13 is a top view of a sunlight sensor according to a different form of a second embodiment of the present invention.
Figure 14:
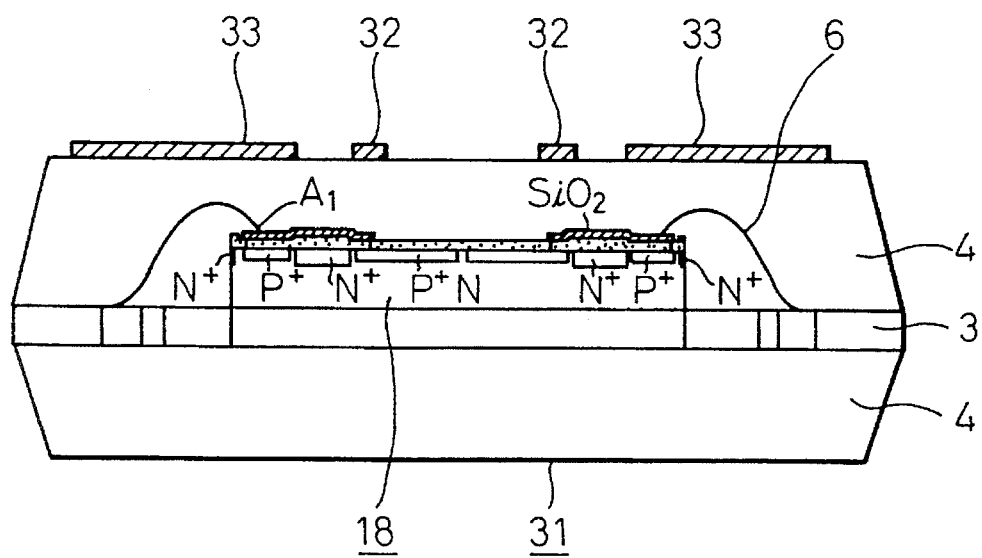
FIG. 14 is a cross-sectional view of a sunlight sensor according to another form of a second embodiment of the present invention.

FIG. 13 and FIG. 14 show a sunlight sensor 31 according to another form of the second embodiment of the present invention, these being, respectively, a top view and a cross-sectional view which show the double ring shape of the light-cutoff mask, that is, an inside light-cutoff mask 32 and an outside light-cutoff mask 33. By means of this arrangement, in addition to further reducing the elevation angle characteristics, it is also possible to further decreases output current when light is incident directly from above (that is, when $\delta°=90°$).

Figure 15:
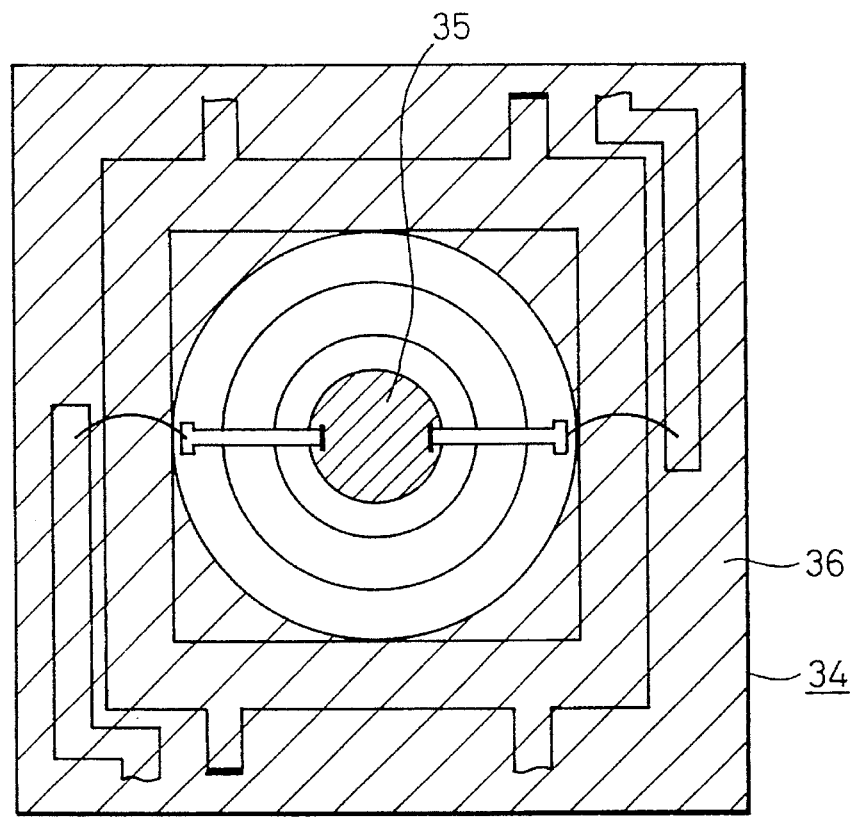
FIG. 15 is a top view of a sunlight sensor according to yet another form of a second embodiment of the present invention.
Figure 16:
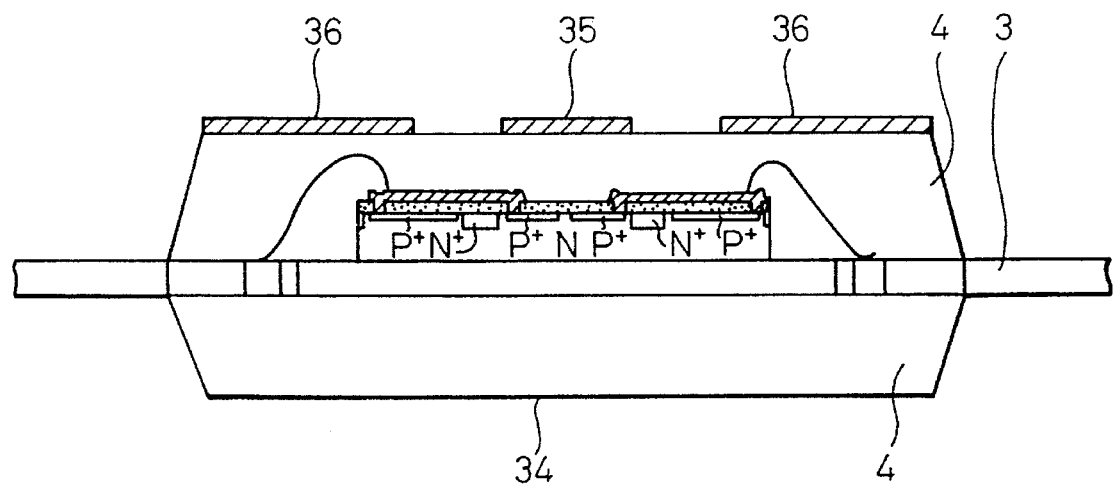
FIG. 16 is a cross-sectional view of a sunlight sensor according to yet another form of a second embodiment of the present invention.

FIG. 15 and FIG. 16 show a sunlight sensor 34 according to yet another embodiment of the present invention, these being, respectively, a top view and a cross-sectional view which show the provision of both an outside light-cutoff mask 36 and the making of the inside light-cutoff mask 35 round. By doing this, there is an increase in the right-to-left output current ratios and an improvement in the right/left angular characteristics when the right/left angle of the incident light (not shown in the drawing) is large.

While this above-described embodiment of a sunlight sensor according to the present invention was described for this case in which a silicon photodiode was used as the light-detection element, it is also possible to use a photodiode made of any other material, as long as it is formed by means of a pn junction. For example, it is possible to use chemical semiconductor materials such as GaAs or InP.

Also, while the epoxy, which is a transparent resin, was used in the above embodiments as the transparent material, it is also possible to use other conventional transparent materials.

Also, while the above description includes a light-cutoff mask in the shape of a ring, because it is technologically easy to form a p+ layer and an n+ or n layer of a silicon photodiode to the shape of the light-cutoff mask, if the respective shapes are established so as to obtain the optimum conditions for the desired sunlight elevation angle characteristics and right/left angular characteristics, these can be any shape, for example, elliptical or rectangular, without sacrificing their characteristics.

In addition, even if the transmissivity is not 100%, there is no sacrifice of the characteristics of the embodiments. For example, when using sunlight as the incident light, if there is less than 10% transmissivity (that is, greater than 90% cutoff) in the wavelength range of sunlight (400 nm to 1100 nm), there is absolutely no problem. As long as this type of transmissivity can be achieved, there is no particular limit on the thickness of the light-cutoff mask. If making the overall device compact is important, it is possible to make the light-cutoff mask ultra-thin, using printing and metal thin-film techniques.

Furthermore, there is absolutely no problem in using a multilayer construction for the transparent material of these embodiments.

It is also possible to have a cover or other element which has transparency on top of the light-cutoff material provided on the top surface of the transparent material.

That is, the second embodiment of the present invention is a sunlight sensor having a light-responsive section which is divided into two regions at the light-receiving surface, a light-nonresponsive section being provided at the ends of each of these light-responsive section areas, a light-detection element which outputs detection signals corresponding to the amount of light received at the above-noted light-responsive sections, and a light-cutoff means which selectively passes the sunlight which is incident to the above-noted light-receiving surface. By means of establishing the relative positions on the light-cutoff means, the light-responsive section and light-nonresponsive section, the amount of surface area of the light-responsive section on which the shadow from the light-cutoff means falls and the amount of surface area of the light-nonresponsive section on which the shadow falls is controlled to achieve the desired elevation angle characteristics while controlling the amount of surface area of the individual light-responsive sections onto which the shadow falls to obtain the desired right/left angular characteristics.

In doing this, by establishing the relative positions of the light-cutoff means, the light-responsive section, and the light-nonresponsive section, the desired elevation angle characteristics are achieved in the same manner as in the first embodiment. In addition, sunlight which is selectively passed by means of the light-cutoff means is caused to strike the two separated regions of the light-responsive section provided on the light-receiving surface. The light-cutoff means controls the surface areas of the individual shadows created at the light-responsive section, thereby producing the desired right/left angular characteristics.

Another possible form of the second embodiment of the present invention is a sunlight sensor having a light-responsive section divided into at least two regions which outputs signals which correspond respectively to sunlight striking these regions, a light-nonresponsive section which does not output a signal regardless of whether or not incident light exists, a light-detection element having the light-receiving surface and the light-nonresponsive section in one and the same plane, a transparent material which has this light-detection element at least in its top part, and a light-cutoff means which is provided at the top of the light-detection element at the prescribed spacing, and which selectively passes sunlight incident on the light-receiving surface of the light-detection element to cause it to strike the light-responsive section and light-nonresponsive section. The light-responsive sections in each of the regions consist of at least an outside light-responsive section which is provided on the outside with respect to the light-receiving surface of the light-detection element and an inside light-responsive section which is provided further inside with respect to the outside light-responsive section, with the light-nonresponsive section in between these two. The light-cutoff means is provided at least directly above the outside light-responsive section. Sunlight incident from the outside edge surface of the light-cutoff means is blocked from striking the outside light-responsive section, and furthermore the light-cutoff means is of such a width as to selectively cause sunlight incident from its inside edge surface to strike the outside light-responsive section.

That is, in the second embodiment of the present invention, in a sunlight sensor that is to be used in attaining the desired elevation angle characteristics, particularly with regard to the right/left angular characteristics, the positional relationship between the light-responsive section and the light-nonresponsive section on the light-receiving surface and the positional relationship between the transparent material and the light-receiving surface have been specially established, and in doing so the conditions are established for incident sunlight reaching the outside light-responsive section which is at the very outside of the light-receiving surface. Specifically, light-cutoff material of a certain width blocks the light incident in a vertical direction from above the light-receiving surface and light which is incident from the outside edge surface of the light-cutoff means at an inclination to the outside light-responsive section. On the other hand, light from the inside light-responsive section to the outside light-responsive section at an inclination is selectively passed. By doing this, light at an inclination to the right and left is given preference in being collected at the light-receiving surface (and in particular at the outside light-responsive section), so that both the desired elevation angle characteristics and the desired right/left angular characteristics are attained.

Furthermore, in the second embodiment of the present invention, it is desirable that the configuration be such that the light-cutoff means is provided directly above the inside light-responsive section, so that it selectively passes to the inside light-responsive section at least part of the sunlight that is incident in a vertical direction from the top with respect to the light-receiving surface of the light-detection element, and it is also preferable that the light-cutoff means be provided directly above the outside light-responsive section and directly above the inside light-responsive section, and that at least one of these light-cutoff means be ring shaped.

A third embodiment of a sunlight sensor according to the present invention will be described below.

Figure 17A:
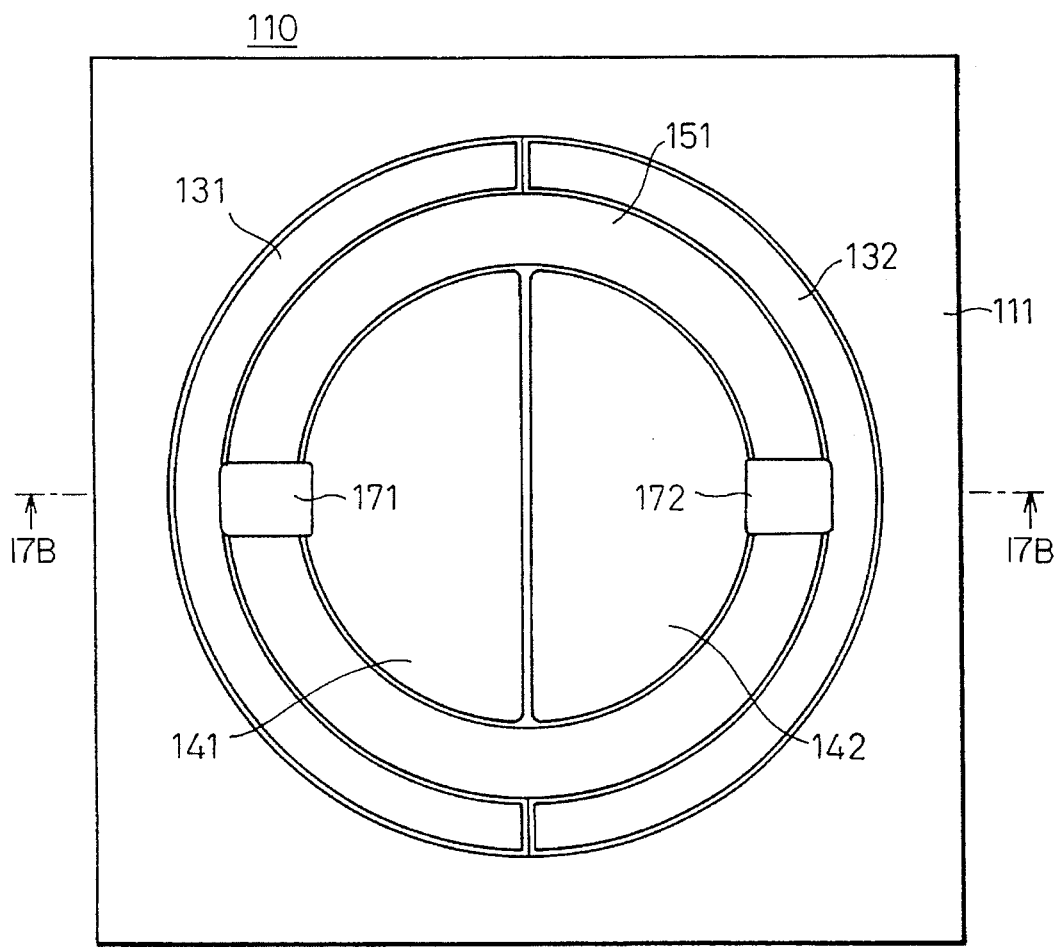
FIGS. 17A and 17B are drawings used to explain the light-detection element of a sunlight sensor according to a third embodiment of the present invention, with FIG. 17A being a top view and FIG. 17B being a cross-sectional view through the cutting line shown as 17B—17B in FIG. 17A.
Figure 17B:
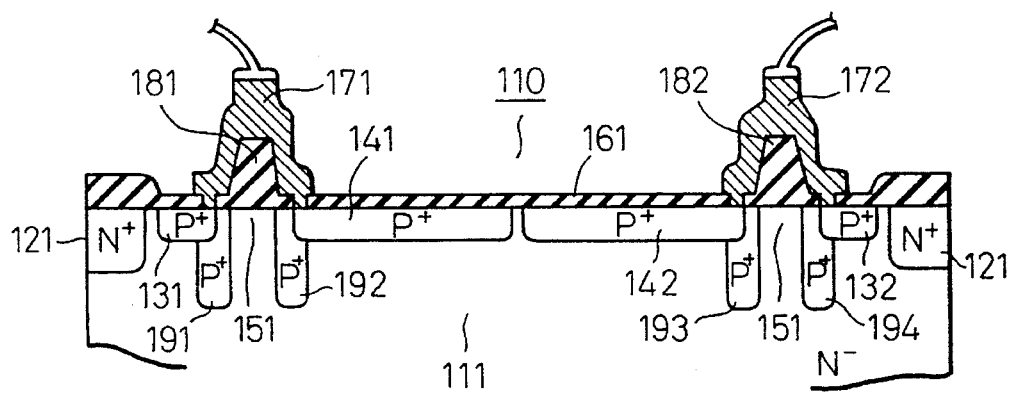

FIGS. 17A, 17B, 18A, and 18B show the configuration of a third embodiment of the present invention. They show the light-detection element 110 in particular, and as shown in FIG. 17A and 17B, an n+ channel stopper 121 corresponding to the outer perimeter of an n-type silicon substrate 111, and outside light-responsive sections 131 and 132 are also formed as p+ layers in the shape of a ring. In addition, inside light-responsive sections 141 and 142 are formed inside these outside light-responsive sections 131 and 132, these also being formed p+ layers.

The inside light-responsive sections 141 and 142 are formed in the center of the silicon substrate as n-type layers forming a disc shape which is split along the direction of its diameter. The outside light-responsive sections 131 and 132 are ring-shaped and concentric with the inside light-responsive sections 141 and 142, these being separated into two parts by, for example, an n-type layer, the line of separation coinciding with the line along which the inside light-responsive sections 141 and 142 are split. A ring shaped light-nonresponsive section 151 is formed as a separation by means of an n-type layer between the disc-shaped inside light-responsive sections 141 and 142 and ring-shaped outside light-responsive sections 131 and 132.

Over the silicon substrate 111 onto which is formed the light-responsive sections 131, 132, 141, and 142 and the light-nonresponsive section 151 is formed an insulating layer 161 as a protective film. In addition, aluminum electrodes 171 and 172 are formed along a diameter of the light-nonresponsive section 151 as bonding pads on the surface of the silicon substrate 111. To alleviate damage that can occur when performing bonding, oxide film layers 181 and 182 are formed between these aluminum electrodes 171 and 172 and the silicon substrate 111, these being of a thickness of, for example, 0.6 to 1.3 µm.

The aluminum electrodes 171 and 172 are formed so as to be connected to the light-responsive sections 131 and 141, as well as 132 and 142, respectively. To prevent aluminum spikes formed by the aluminum ohmic heat treating, deep p+ layers 191 to 194, of a depth of approximately 1 to 3 µm, are formed in the part of the aluminum electrodes which make contact with the p+ layers. Because the bonding pads of aluminum electrodes 171 and 172 are located over the ring-shaped light-nonresponsive section 151, they are positioned approximately 450 µm from the edge of the semiconductor chip formed by the silicon substrate 111.

Figure 18A:
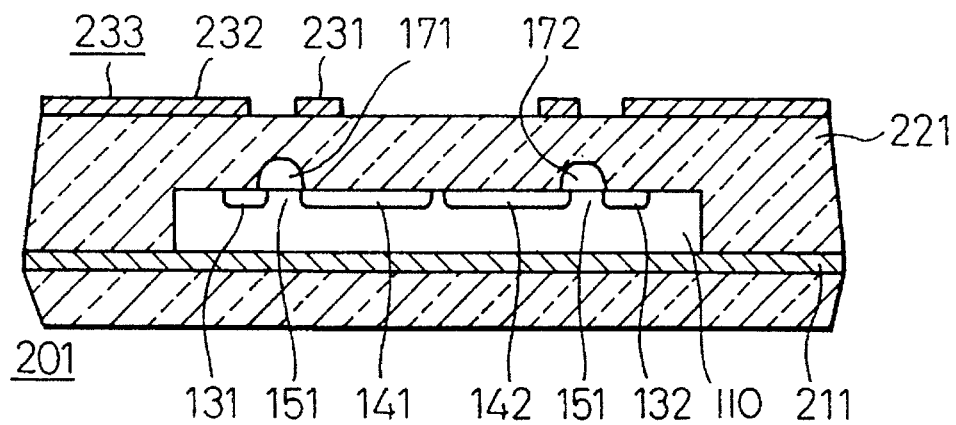
FIG. 18A is a drawing which shows the cross-sectional construction of a sunlight sensor which includes the above-described light-detection element in a third embodiment of the present invention.
Figure 18B:
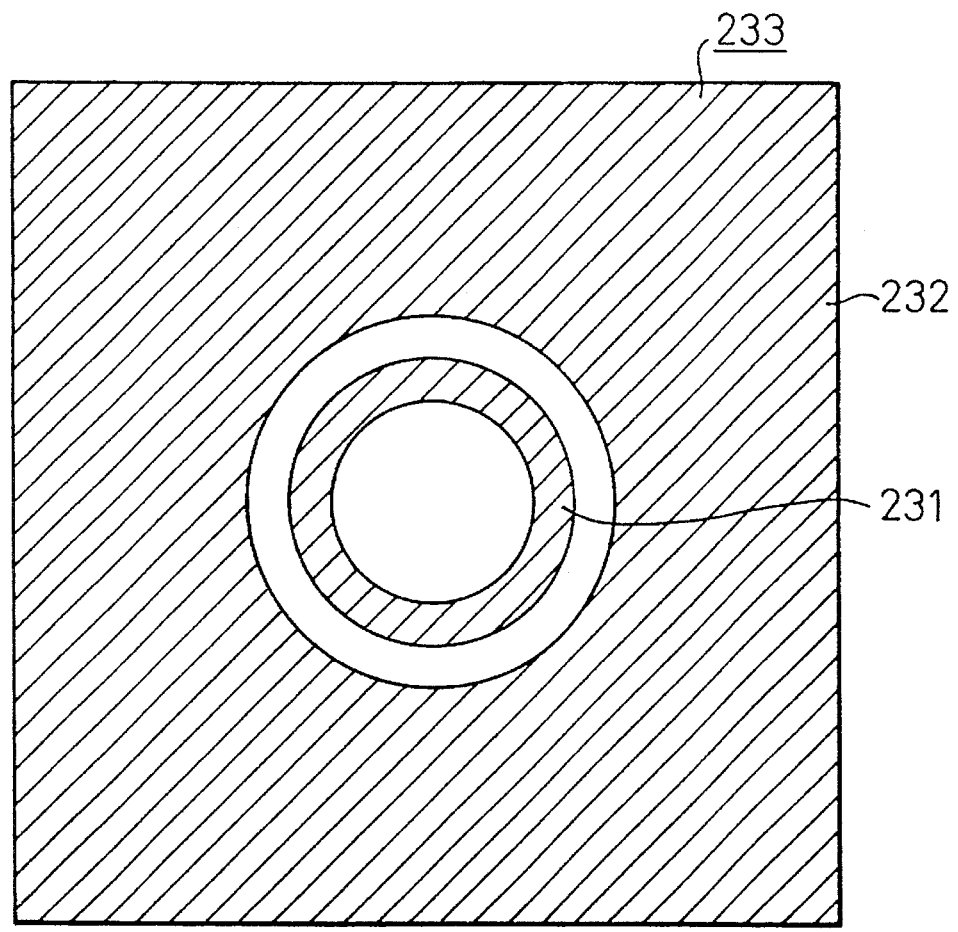
FIG. 18B is a drawing of the pattern of the light-cutoff mask of the above-noted sunlight sensor.
Figure 19:
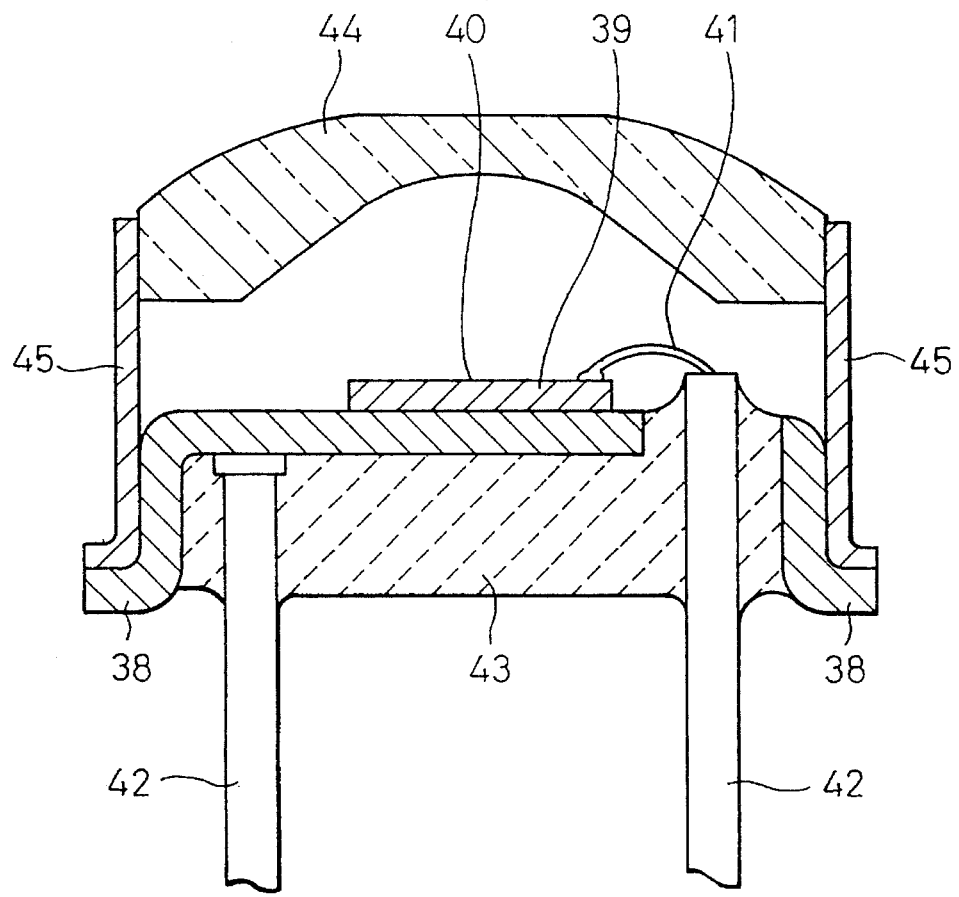
FIG. 19 is a cross-sectional view of a sunlight sensor of the prior art.

FIGS. 18A and 18B show the configuration of a sunlight sensor 20 which has within it a light-detection element 110 having the above-described construction. This light-detection element 110 is mounted on an appropriate lead frame 211. This lead frame 211 is molded, along with the light-detection element 110, into a resin molding made of, for example, epoxy, which serves as the transparent material, a light-transmitting layer being formed over the surface formed by the light-responsive sections 131, 132, 141, and 142, which form the light-receiving surface of the light-detection element 110, with sunlight passing through this light-transmitting layer 221 striking each of the light-responsive sections 131, 132, 141, and 142.

A photodiode chip type of light-detection element formed from silicon and the surrounding transparent molding are subjected to thermal shock because the coefficients of thermal expansion of the silicon and the transparent resin differ. Stress is applied to the bonding wire which goes into the molding material, particularly at the location at which it makes connection to the chip. When this type of thermal shock is applied repeatedly, the bonding wire breaks, making it impossible to obtain an output from the light-detection element.

However, by forming the bonding pads, to which connection to the bonding wires is made, on the light-nonresponsive section 151, the distance of which inward from the outer perimeter of the silicon substrate is established, it is possible to reliably control the stress applied to the bonding wires without influencing the effective light-receiving surface area, this resulting in a great improvement in the reliability of the sunlight sensor. That is, when there is a great difference in coefficient of thermal expansion between the epoxy and silicon that make up the light-transmitting layer 221, even if stress should occur between the resin molding material and the silicon substrate 111 as a result of applied thermal shock, that stress will be maximum at the outer perimeter part of the silicon substrate 111, becoming smaller closer to center of the substrate 111. For this reason, by establishing a large distance between the position of the bonding pads and the outer perimeter of the silicon surface 111, there is a dramatic improvement in the life of the bonding wires that are connected to the aluminum electrodes 171 and 172.

A light-cutoff mask 233 is formed on the surface of the light-transmitting layer 221. This light-cutoff mask 233 comprises a ring-shaped first light-cutoff mask 231, which is positioned on the inside of the position directly above the ring-shaped light-nonresponsive section 151, and a second light-cutoff mask 232, which is formed to surround the first light-cutoff mask 231, leaving a width between it and the first light-cutoff mask which corresponds to the width of the light-nonresponsive section 151, so that light which passes through the circular light-transmitting section in the center of the first light-cutoff mask 231 and light which passes through the light-transmitting section between the first light-cutoff mask 231 and the second light-cutoff mask 232 strike the light-receiving surface of the light-detection element 110.

With the sun directly above this sunlight sensor 201, the sunlight is incident to the light-receiving surface of the light-detection element in the vertical direction. When the sunlight is incident from an inclination from the top, the light detection output from this light-detection element 110 will differ, mainly due to the angular dependency on the amount of light and the angular dependency of the amount of absorption within the light-transmitting layer 221, and due to the reduction in light-receiving surface area (overall amount of received light) because of the effect of the light-cutoff mask 233.

Of these effects, the effect of the shadow of the light-cutoff mask 233 in controlling the elevation angle dependency characteristics of the light-detection element 110 is large. Therefore, it is necessary to optimize the light-cutoff mask 233, the light-responsive sections 131, 132, 141, and 142, and the light-nonresponsive section 151. For this reason Japanese Patent Application No. 5-313020, which is related to a filing by the inventors of this application, was proposed. Specifically, if characteristics are established so that when the light which passes through the circular part at the center of the first light-cutoff mask 231 and the light which passes through the ring-shaped part between the first light-cutoff mask 231 and the second light-cutoff mask 232 is at an elevation angle at which it strikes a large surface area on the light-responsive sections 131, 132, 141, and 142, the detection output from the light-detection element 110 is to be maximum, and as the elevation angle varies from this elevation angle of maximum detection output, the detection output decreases, it is possible to perform effective control of, for example, the temperature-controlling mechanism of a vehicular air conditioner. Specifically, under the sunlight conditions at which the temperature within a vehicle rises the most, it is possible to increase the cooling level of the air conditioner.

Specifically, in the case in which sunlight is incident to the light-receiving surface at a vertical angle of 90°, only light which passes through the central aperture of the first light-cutoff mask 231 strikes the light-responsive sections 141 and 142, the surface area of incidence being limited by the surface area of the aperture of the first light-cutoff mask 231 (which is smaller than the total of surface areas or the light-responsive sections 131 and 132). The elevation angle characteristics are established so that when light is incident to the light-receiving surface at an inclination of, for example, 45° light which passes through the aperture of the first light-cutoff mask 231 and light which passes through the ring-shaped aperture between the first light-cutoff mask 231 and the second light-cutoff mask 232 strike the light-responsive sections 141 and 142 as well as the light-responsive sections 131 and 132. The maximum output is obtained at this elevation angle of 45°.

Because the light-responsive sections 131 and 132, and the light-responsive sections 141 and 142 are designed so as to be divided right-to-left, it is possible to distinguish light incident from the left from light incident from the right, enabling control in accordance with the direction of incident sunlight, for example, by separate cooling control of the driver's and the front passenger's seat in a vehicle.

In this embodiment, the circular region in the center of the silicon substrate which forms the light-detection element 110 is divided into the two light-responsive sections 141 and 142, with the ring-shaped region surrounding this circular region divided into the two light-responsive sections 131 and 132, thereby making it possible to distinguish sunlight which is incident from the right and left. However, if there is no particular need to distinguish right and left sunlight, the light-responsive sections 141 and 142 can be formed as a single circular region, and the light-responsive sections 131 and 132 can be formed as a single ring-shaped region. It is also possible to establish the shape of pattern of the light-cutoff mask 233 in relationship to the shapes of the light-responsive sections 131, 132, 141, and 142 to enable any arbitrary elevation angle characteristics.

In a sunlight sensor 201 configured in this manner, considering the connection of bonding wires to the lead frame, a usual approach would be to establish the position of the bonding pads near the outer perimeter of the silicon substrate 111. However, in a light-detection element 110 having bonding pads formed at a position near the outer perimeter of the silicon substrate 111, when molding in epoxy and formation of the light-transmitting layer 221 is done, the action of thermal shock applied to the light-detection element 110 is accompanied by stress, this being concentrated at the outer perimeter of the silicon substrate 111. For that reason, if bonding wires are connected near this outer perimeter of the silicon substrate 111, stress is applied to the connection of the bonding wires to the silicon substrate 111, thus causing breakage of the bonding wires.

What is more important is that bonding pads positioned near the outer perimeter of the silicon substrate 111 inevitably block part of the light-responsive section, which leads to a reduction in the effective light-receiving surface area. In contrast to this, however, in the light-detection element 110 of the embodiment, because the bonding pads are formed over the ring-shaped light-nonresponsive section 151, this does not cause a reduction in the effective light-receiving surface area, enabling the attainment of a reliable sensor device with a detection signal connection mechanism that does not hinder detection sensitivity.

In a sunlight sensor according to the third embodiment of the present invention, a semiconductor device is configured as a light-detection element in which, in addition to the forming of a light-responsive section on at least one part of a light-receiving surface, a light-nonresponsive section is formed on at least yet a different part of this light-receiving surface. A detection signal which corresponds to the amount of light received at the light-responsive section is produced. At minimum a light-transmitting material is established on the light-receiving surface, a light-cutoff means being provided on the light-transmitting means which selectively cuts off sunlight which is incident to the light-receiving surface, a bonding pad being formed on the light-nonresponsive section of the light-receiving surface of the light-detection element, the detection signal being obtained from the bonding wire connected to this bonding pad. By means of this configuration, sunlight strikes the light-receiving surface via the light-cutoff means, and a shadow is established by the relative positions of the light-responsive section and the light-nonresponsive section with respect to the light-cutoff means. A detection signal is output in response to the amount of sunlight incident to the light-responsive section. This detection signal is obtained via a bonding wire, the bonding pad to which this bonding wire is connected being formed on the light-nonresponsive section, making it possible to perform highly efficient detection of incident sunlight without influencing the functioning of the light-responsive section. In particular in a sunlight sensor device, by establishing the individual pattern shapes of the light-responsive section and the light-nonresponsive section, it is possible to obtain the desired elevation angle characteristics, thus eliminating the need to use this in combination with costly high-precision materials as was necessary in the past with lens mechanisms, thereby improving the efficiency of the manufacturing process.

More specifically, characteristics of this embodiment are the formation of a bonding pad on the light-nonresponsive section and the connection of a bonding wire to this bonding pad, and the formation of the transparent material as a transparent resin molding, into which is buried the bonding wire.

In addition, in this embodiment it is preferable to have the bonding pad formed on the region of the light-nonresponsive section, the signal being obtained via a wire connected to this bonding pad, and it is desirable to have the bonding pad formed on the region of the light-nonresponsive section, with the transparent material being formed as a transparent resin molding, and to have the bonding wire which is connected to the bonding pad buried in this transparent resin molding.

Figure 20:
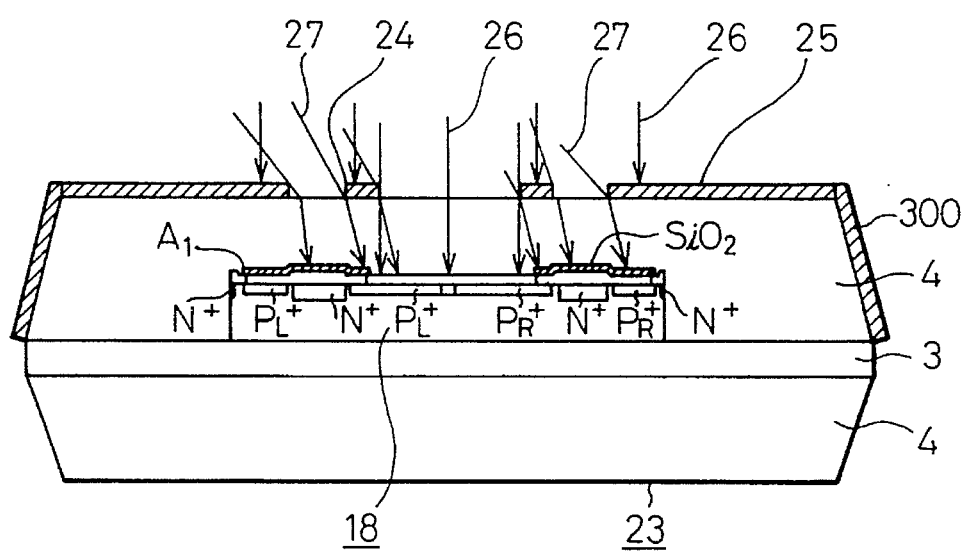
FIG. 20 is a drawing of a sunlight sensor according to a fourth embodiment of the present invention.

FIG. 20 shows a fourth embodiment of the present invention. While the basic configuration of this fourth embodiment is approximately the same as the embodiments described above, the width of the light-cutoff means 25 is expanded, and it is positioned so as to extend to the side surface of the light-detection element 300. That is, it is preferable that the light-cutoff means 25 be provided at a prescribed spacing from the light-detection element, and that it have a width such that it extends from directly above the light-responsive section to the side surface of the light-detection element 300.

By doing this, not only is sunlight which is incident from the outside edge surface of this light-cutoff mask (that is, sunlight which is at a low elevation angle and which is incident from the direction of the side surface of the light-detection element) prevented from directly striking the outside light-responsive section, but also it is possible to prevent such sunlight from being reflected by, for example, the lead frame, and striking the outside light-responsive section as reflected light.

In a sunlight sensor configured as described above, it is preferable that the relative positions of the light-cutoff means, the light-responsive section, and the light-nonresponsive section be established so that the detection output is maximum for the case in which sunlight is incident to the light-receiving surface via the light-cutoff means at an inclination from the right or left.

Also, it is preferable to provide the light-nonresponsive section on both ends of the light-responsive section or two divided areas of the light-responsive section, and to additionally provide outside light-responsive sections on the outside of these light-nonresponsive section, and to provide a light-cutoff means at minimum on the transparent material directly above the outside light-responsive sections.

In addition, in the present invention it is also possible to use a single-crystal silicon photodiode as the light-detection element, and it is preferable that the light-responsive section and light-nonresponsive section provided in the light-detection element be formed from pn junction diodes, a pn junction being formed at the light-responsive section but not at the light-nonresponsive section.

In the present invention, the transparent material is made of resin, and is preferably made of, for example, epoxy.

As described above, in the first embodiment of the present invention, the surface area of the shadow of the light-cutoff means which falls onto the light-responsive section and the light-nonresponsive section when sunlight is received is controlled by establishing the relative positions of the light-cutoff means, the light-responsive section, and the light-nonresponsive section, thereby achieving superior effectiveness in detecting sunlight and in achieving the desired elevation angle characteristics without using a lens as was used in the prior art.

In the second embodiment of the present invention, by establishing the relative positions of the light-cutoff means, the light-responsive section, and the light-nonresponsive section, superior effectiveness is achieved, in terms of not only attaining the desired elevation angle characteristics but also, because the surface area of the shadow which falls onto the light-responsive section which is divided into two regions is controlled, in terms of attaining the desired right/left angular characteristics as well.

In addition, because the relative positions of the light-cutoff means, the light-responsive section, and the light-nonresponsive section are established so that the detection signal output is maximum when sunlight is incident at an inclination from the right or left, it is possible to attain the desired elevation angle characteristics in which the maximum output does not occur when incident sunlight is received from directly overhead.

In the third embodiment of the present invention, in performing detection of sunlight using a semiconductor light-detection element, not only is it possible to use a configuration by which the desired elevation angle characteristics are attained, by using a semiconductor light-detection element, without the need for a material of highly precise shape, it is possible, for example, to obtain a detection output which is responsive to the position of the incident sunlight, particularly effective use being made of the light-responsive section, thereby enabling effective use of the light-nonresponsive section in obtaining detection signal without influencing the light detection sensitivity, this resulting in the achievement of a highly reliable and stable detection capability.

We claim:

1. A sunlight sensor comprising:

a light-detection element having a light-receiving surface, said light-receiving surface comprising:

a light-responsive section which generates a signal corresponding to an amount of light which strikes said light-responsive section, and a light-nonresponsive section which generates no signal in response to light which strikes said light-nonresponsive section, said light-responsive section and said light-nonresponsive section being substantially co-planar with one another;

a substantially transparent material covering at least a top portion of said light-detection element; and a light-cutoff means, disposed above said light-detection element at a prescribed distance therefrom, said light-cutoff means having a hole portion disposed directly above at least a portion of said light-responsive section and an outside edge, said light-cutoff means selectively passing sunlight incident upon said sensor through said hole portion and outside of said outside edge to said light-receiving surface of said light-detection element so that the selectively passed sunlight strikes at least a portion of said light-responsive section and said light-nonresponsive section, said light-responsive section generating a signal corresponding to a sum of sunlight passing through said hole portion and striking said light-responsive section, and sunlight passing outside of said outside edge of said light-cutoff means and striking said light-responsive section, the light-responsive section, the light-nonresponsive section, and the light-cutoff means being oriented with respect to each other such that the sum of sunlight striking said light-responsive section is dependent on an incident angle of the sunlight.

2. A sunlight sensor according to claim 1, wherein said light responsive section includes an outside light-responsive section provided proximate an outer portion of the light-receiving surface of said light-detection element, and an inside light-responsive section provided inside said outside light-responsive section, said light-nonresponsive section being provided between said outside light-responsive section and said inside light-responsive section, and further wherein said light-cutoff means is provided minimally directly above said outside light-responsive section.

3. The sensor of claim 2, wherein said outside light-responsive section, said inside light-responsive section, said light-nonresponsive section, and said light-cutoff means are oriented with respect to one another such that when sunlight is incident upon said sensor from above said sensor in a direction normal to said top portion of said light-detection element, the sum of sunlight strikes only said inside light-responsive section and when sunlight is incident upon said sensor at an-angle with respect to a normal to the top portion of said light-detection element, the sum of sunlight striking said inside light-responsive section and said outside light-responsive section is dependent on the incident angle.

4. A sunlight sensor according to claim 1, wherein said light-cutoff means includes at least one ring-shaped form.

5. A sunlight sensor according to claim 11, wherein said light-cutoff means is a light-cutoff mask formed in said transparent material.

6. A sunlight sensor according to claim 1, wherein a bonding pad is formed in a region of said light-nonresponsive section, said signal being obtained from a bonding wire connected to said bonding pad.

7. A sunlight sensor according to claim 1, wherein a bonding pad is formed in a region of said light-nonresponsive section and a bonding wire is connected to said bonding pad, and wherein said substantially transparent material is formed by molding a transparent resin, said bonding wire being buried in said molded transparent resin.

8. A sunlight sensor comprising:

a light-detection element having a light-receiving surface, said light-receiving surface comprising:

a light-responsive section including:

an outside light-responsive section disposed proximate an outer portion of said light-receiving surface, and an inside light-responsive section disposed inside said outside light-responsive section, said light-responsive section generating a signal proportional to a total amount of light which strikes said inside light-responsive section and said outside light-responsive section, and a light-nonresponsive section disposed between said outside light-responsive section and said inside light-responsive section, said light-nonresponsive section generating no signal in response to light striking said light-nonresponsive section, said inside light-responsive section, said outside light-responsive section, and said light-nonresponsive section being substantially co-planar with one another;

a substantially transparent material covering at least a top portion of said light-detection element; and a light-cutoff means for selectively passing sunlight incident upon said sensor to at least one of said outside light-responsive section, said inside light-responsive section, and said light-nonresponsive section, said light-cutoff means being disposed above said light-detection element at a prescribed distance therefrom, at least a portion of said light-cutoff means being oriented directly above said outside light-responsive section so that when sunlight is incident from above said sensor in a direction normal to said light-receiving surface, said light-cutoff means passes sunlight to said inside light-responsive section and passes no sunlight to said outside light-responsive section, and when sunlight is incident from above said sensor in a direction making an angle with respect to the normal to said light-receiving surface, an amount of light passed to said inside light responsive section and an amount of light passed to said outside light responsive section depending on the incident angle.

9. A sunlight sensor according to claim 8, wherein said light-cutoff means is further provided directly above said inside light-responsive section, whereby at least part of the sunlight incident in the direction normal to said light-receiving surface is selectively caused to strike said inside light-responsive section.

10. A sunlight sensor according to claim 9, wherein said light-cutoff means which is provided directly above said inside light-responsive section is circular.

11. A sunlight sensor according to claim 8, wherein said light-cutoff means is further provided directly above said inside light-responsive section, whereby said light-cutoff means consists of at least one ring-shaped formation.

12. A sunlight sensor according to claim 8, wherein said light-cutoff means is a light-cutoff mask formed in said transparent material.

13. A sunlight sensor according to claim 8, wherein said light-cutoff means has a prescribed width extending from directly above said outside light-responsive section to a side surface of said light-detection element.

14. A sunlight sensor according to claim 8, wherein a bonding paid is formed in a region of said light-nonresponsive section, and wherein said signal generated by said light-responsive section is obtained via a wire which is connected to said bonding pad.

15. A sunlight sensor according to claim 8, wherein a bonding pad is formed in a region of said light-nonresponsive section and a bonding wire is connected to said bonding pad, and wherein said substantially transparent material is a transparent resin molding, said bonding wire being buried in said transparent resin molding.

16. A sunlight sensor according to claim 8, wherein said outside and inside light-responsive sections are divided into left and right regions so that the sensor differentiates between light incident on said sensor from a direction to the right of said sensor and light incident on said sensor from a direction to the left of said sensor.

* * * * *